US009165679B2

(12) United States Patent
Oh et al.

(10) Patent No.: US 9,165,679 B2
(45) Date of Patent: Oct. 20, 2015

(54) POST PACKAGE REPAIRING METHOD, METHOD OF PREVENTING MULTIPLE ACTIVATION OF SPARE WORD LINES, AND SEMICONDUCTOR MEMORY DEVICE INCLUDING FUSE PROGRAMMING CIRCUIT

(71) Applicant: SAMSUNG ELECTRONICS CO., LTD., Suwon-si (KR)

(72) Inventors: Jong-min Oh, Seoul (KR); Yung-young Lee, Seongnam-si (KR); Hoyoung Song, Hwaseong-si (KR); Chiwook Kim, Hwaseong-si (KR); Donghyun Sohn, Hwaseong-si (KR)

(73) Assignee: SAMSUNG ELECTRONICS CO., LTD., Suwon-Si (KR)

( * ) Notice: Subject to any disclaimer, the term of this patent is extended or adjusted under 35 U.S.C. 154(b) by 24 days.

(21) Appl. No.: 14/030,066

(22) Filed: Sep. 18, 2013

(65) Prior Publication Data

US 2014/0078842 A1 Mar. 20, 2014

(30) Foreign Application Priority Data

Sep. 18, 2012 (KR) .......................... 10-2012-0103550
Nov. 21, 2012 (KR) .......................... 10-2012-0132477
May 3, 2013 (KR) .......................... 10-2013-0050264

(51) Int. Cl.
*G11C 29/50* (2006.01)
*G11C 29/04* (2006.01)
*G11C 29/00* (2006.01)
G11C 8/08 (2006.01)
G11C 8/14 (2006.01)

(52) U.S. Cl.
CPC .............. *G11C 29/04* (2013.01); *G11C 29/785* (2013.01); *G11C 29/808* (2013.01); *G11C 8/08* (2013.01); *G11C 8/14* (2013.01); *G11C 29/50* (2013.01)

(58) Field of Classification Search
CPC ............................. G11C 29/808; G11C 29/50
USPC ....................... 365/200, 201, 225.7
See application file for complete search history.

(56) References Cited

U.S. PATENT DOCUMENTS

| 6,108,261 | A | 8/2000 | Kim et al. |
| 6,240,033 | B1 | 5/2001 | Yang et al. |
| 6,310,807 | B1 | 10/2001 | Ooishi et al. |
| 6,430,100 | B2 | 8/2002 | Kim |
| 6,567,333 | B2 | 5/2003 | Toda |
| 6,581,174 | B2 | 6/2003 | Stubbs |
| 6,667,915 | B2 | 12/2003 | Yonezu et al. |

(Continued)

FOREIGN PATENT DOCUMENTS

| JP | 2003-100094 A | 4/2003 |
| KR | 10-0399435 B1 | 9/2003 |

(Continued)

*Primary Examiner* — Shawki S Ismail
*Assistant Examiner* — Muhammad Islam
(74) *Attorney, Agent, or Firm* — Sughrue Mion, PLLC

(57) ABSTRACT

Provided is a method of preventing simultaneous activation of redundancy memory line or spare word lines, the method including: programming a fail address of a memory line determined to be defective; reprogramming the fail address if a first spare line for the memory line is determined to be defective; storing additional information with respect to the reprogrammed fail address; and activating a second spare line and inactivating the first spare line, referring to the additional information.

14 Claims, 23 Drawing Sheets

(56) References Cited

U.S. PATENT DOCUMENTS

| | | | |
|---|---|---|---|
| 6,668,344 B1 * | 12/2003 | Sakata et al. | 714/710 |
| 6,972,587 B2 | 12/2005 | Zimlich | |
| 7,035,152 B1 | 4/2006 | Bae et al. | |
| 7,085,971 B2 | 8/2006 | Barth, Jr. et al. | |
| 7,339,844 B2 | 3/2008 | Krech, Jr. et al. | |
| 7,468,922 B2 | 12/2008 | Callaway et al. | |
| 7,486,577 B2 | 2/2009 | Kim et al. | |
| 7,688,663 B2 | 3/2010 | Chu et al. | |
| 7,746,712 B2 | 6/2010 | Kang et al. | |
| 7,924,646 B2 | 4/2011 | Im et al. | |
| 8,174,913 B2 * | 5/2012 | Hashimoto et al. | 365/200 |
| 8,289,790 B2 | 10/2012 | Rooney et al. | |
| 8,509,014 B2 * | 8/2013 | Shvydun et al. | 365/200 |
| 2002/0026606 A1 | 2/2002 | Stubbs | |
| 2002/0159310 A1 | 10/2002 | Park et al. | |
| 2002/0191468 A1 | 12/2002 | Toda | |
| 2003/0058716 A1 * | 3/2003 | Yonezu et al. | 365/201 |
| 2003/0084386 A1 | 5/2003 | Barth, Jr. et al. | |
| 2003/0112029 A1 | 6/2003 | Zimlich | |
| 2003/0123301 A1 | 7/2003 | Jang et al. | |
| 2007/0002646 A1 * | 1/2007 | Martin et al. | 365/200 |
| 2007/0133323 A1 | 6/2007 | Kim et al. | |
| 2007/0195618 A1 | 8/2007 | Krech et al. | |
| 2007/0195623 A1 | 8/2007 | Callaway et al. | |
| 2008/0247243 A1 | 10/2008 | Kang et al. | |
| 2009/0141577 A1 | 6/2009 | Chu et al. | |
| 2009/0168581 A1 | 7/2009 | Im et al. | |
| 2011/0280091 A1 * | 11/2011 | Rooney et al. | 365/200 |
| 2013/0077420 A1 * | 3/2013 | Iwai et al. | 365/200 |

FOREIGN PATENT DOCUMENTS

| | | |
|---|---|---|
| KR | 10-0498456 B1 | 7/2005 |
| KR | 10-0586068 B1 | 6/2006 |
| KR | 10-2010-0064158 A | 6/2010 |

* cited by examiner

POST PACKAGE REPAIRING METHOD, METHOD OF PREVENTING MULTIPLE ACTIVATION OF SPARE WORD LINES, AND SEMICONDUCTOR MEMORY DEVICE INCLUDING FUSE PROGRAMMING CIRCUIT

CROSS-REFERENCE TO RELATED APPLICATIONS

This application claims priority from Korean Patent Application Nos. 10-2012-0103550, 10-2012-0132477, and 10-2013-0050264 filed Sep. 18, 2012, Nov. 21, 2012, and May 3, 2013, respectively, in the Korean Intellectual Property Office, the entire disclosures of which are incorporated herein by reference.

BACKGROUND

Apparatuses and methods consistent with exemplary embodiments relate to a semiconductor memory field, and more particularly, relate to techniques of preventing multiple activation of spare word lines and executing post package repairing and a semiconductor memory device including a fuse programming circuit.

If at least one of memory cells of a semiconductor memory device is defective, a function of the semiconductor memory device may not be performed normally. In this case, the semiconductor memory device may become a bad product. To manage a semiconductor memory device including a few defective memory cells as a bad product may be inefficient in terms of product yield.

In general, a semiconductor memory device may have redundancy memory cells. When defective memory cells are generated, they may be replaced with redundancy memory cells. In this case, the semiconductor memory device may be considered as a good product. In particular, a defect repair executed after a package process may be referred to as a post package repair operation. Product yield may be improved through the post package repair operation. However, in the post package repair operation, multiple redundancy line may be simultaneously activated to repair a single defective memory line.

SUMMARY

According to an aspect of an exemplary embodiment, there is provided a method of preventing simultaneous activation of redundancy lines such as spare word lines, the method including: programming a fail address of a memory line determined to be defective; reprogramming the fail address if a first spare line for the memory line is determined to be defective; storing additional information with respect to the reprogrammed fail address; and activating a second spare line and inactivating the first spare line, referring to the additional information.

If the second spare line is determined to be defective, information representing that a further repair of the memory cell is impossible may be output.

The fail address may be programmed and reprogrammed using an anti-fuse array unit of an anti-fuse circuit comprising a plurality of anti-fuse array units, the anti-fuse array unit including at least one anti-fuse.

The additional information may be stored regardless of history information about a previous repair of a memory cell connected to the memory line.

The additional information may be indicated at an anti-fuse array unit of an anti-fuse circuit comprising a plurality of anti-fuse array units, the anti-fuse array unit including at least one anti-fuse and being used for the reprogramming the fail address.

A memory cell connected with the spare line may be a dynamic random access memory (DRAM) cell.

The addition information may be stored in a form at least one or more bits.

The additional information may be indicated at an anti-fuse array unit of an anti-fuse circuit comprising a plurality of anti-fuse array units, the anti-fuse array unit including at least one anti-fuse and being used for the programming the fail address.

The storing additional bit information with respect to the reprogrammed fail address may include programming an additional bit of the programmed fail address, and the second spare line may be activated referring to the additional bit.

The additional bit may be programmed based on history information about a previous repair of a memory cell connected to the memory line.

The additional bit may be programmed by rupturing an anti-fuse of an anti-fuse array comprising a plurality of anti-fuse arrays, the anti-fuse array being used for the programming the fail address.

The first or second spare line may be a spare word line among the spare word line and a spare bit line.

The method may further include generating a priority signal and a blocking signal, wherein the second spare line is activated by the priority signal and all other spare lines including the first spare line are inactivated by the blocking signal.

A memory cell connected with the spare line may be a volatile memory cell.

The method may further include programming an additional bit of the reprogrammed fail address if the second spare line is determined to be defective.

According to an aspect of another exemplary embodiment, there is provided a semiconductor memory device, including: a circuitry configured to program a fail address of a memory line determined to be defective, reprogram the fail address if a first spare line for the memory line is determined to be defective, and store additional information with respect to the reprogrammed fail address; a memory cell array including a normal memory cell block, including the memory line, and a spare cell block including the first spare line; and a control circuit configured to activate a second spare line in the spare cell block and inactivate the first spare line, referring to the additional information.

According to an aspect of still another exemplary embodiment, there is provided a post package repair method of a semiconductor memory device, the method including: receiving a post package repair command; comparing a number of defective bits and a number of usable redundancy bits for determining whether the post package repair command is executable, in response to the post package repair command; and replacing a defective cell with a redundancy memory cell according to the comparison result.

The post package repair method may further include outputting a fail message indicating that the post package repair command is not executable, according to the comparison result.

The comparing the number of defective bits and the number of usable redundancy bits may include: calculating the number of usable redundancy bits referring to redundancy information indicating a use state of a redundancy line; and comparing the calculated number of usable redundancy bits and the number of defective bits.

The comparing the number of defective bits and the number of usable redundancy bits may further include: reading the redundancy information from a tag cell corresponding to the redundancy line.

The redundancy line may include a plurality of memory cells connected with the same word line.

The memory cells may include the tag cell.

The redundancy line may include a plurality of memory cells connected with the same bit line.

The replacing the defective cell with the redundancy memory cell according to the comparison result may include: programming an address of a defective line including the defective cell as a fail address; determining whether an input address coincides with the stored fail address; and activating a redundancy line including the redundancy memory cell in response to the input address, based on the determination result.

The replacing the defective cell with the redundancy memory cell according to the comparison result may further include: updating redundancy information indicating of a use state of the redundancy line.

The defective cell and the redundancy memory cell may be DRAM cells.

According to an aspect of still another exemplary embodiment, there is provided a semiconductor memory device which may include: a memory cell array including a memory block having a plurality of memory cells connected with a plurality of word lines and a redundancy block having a plurality of redundancy memory cells connected with a plurality of redundancy word lines; an address decoder configured to activate at least one of the word lines in response to an input address; a sense amplifier circuit configured to read redundancy information, indicating a use state of the redundancy memory cells, from the redundancy block; a counter configured to calculate a number of usable redundancy bits based on the read redundancy information; control logic configured to perform a post package repair operation on a defective cell of the memory cells according to the calculated number of usable redundancy bits; and a circuitry configured to program a fail address corresponding to a defective word line connected with the defective cell when the post package repair operation is performed.

The circuitry may be configured to activate at least one of the redundancy word lines instead of the defective word line when the fail address is received as the input address.

The circuitry may include: an anti-fuse array configured to program the fail address; and a fuse box configured to compare the fail address and the input address and activate at least one of the redundancy word lines instead of the defective word line according to the comparison result.

The circuitry may further include: a parallel-serial converter configured to convert parallel data from the anti-fuse array into serial data, the serial data being provided to the fuse box.

The redundancy block may include tag cells respectively connected to the redundancy word lines and configured to store the redundancy information.

According to an aspect of still another exemplary embodiment, there is provided a semiconductor memory device which may include: an anti-fuse array including a plurality of anti-fuse array units configured to program a fail address for a memory cell repair; and a fuse programming circuit, wherein if a fail address is additionally generated after the fail address is programmed at the anti-fuse array, the fuse programming circuit searches for at least one valid anti-fuse array unit in the anti-fuse array to program the additionally generated fail address at the searched valid anti-fuse array unit, without previous repair information indicating a location of an anti-fuse array unit in the anti-fuse array where the fail address is programmed.

Each of the anti-fuse array units may include a plurality of anti-fuses.

The fuse programming circuit may include: a fuse row decoder configured to select a row of the anti-fuse array; a fuse column decoder configured to select a column of the anti-fuse array; a fuse sensing unit configured to sense whether anti-fuse array units are programmed; a decision circuit configured to search for the valid anti-fuse array unit in response to a fuse sensing signal of the fuse sensing unit; and a program controller connected to the fuse row decoder, the fuse column decoder and the decision circuit and configured to control programming on the valid anti-fuse array unit.

To search for the valid anti-fuse array unit, the fuse column decoder may be configured to apply a scanning voltage to a selected column of the anti-fuse array according to a control of the program controller.

For the programming on the valid anti-fuse array unit, the fuse column decoder is configured to apply a rupture voltage to a selected column of the valid anti-fuse array unit according to a control of the program controller.

The fuse row decoder may be configured to receive an enable signal from the program controller to search for the valid anti-fuse array unit and receive a hold signal from the program controller if the valid anti-fuse array unit is searched for.

The program controller may be enabled if the fail address is additionally generated.

The semiconductor memory device may further include: a memory cell array including a plurality of memory cells, wherein if the fail address is additionally generated after the fail address is programmed at the anti-fuse array by rupturing a part of the anti-fuses, the fuse programming circuit searches for at least one valid anti-fuse array unit, not ruptured, from among the anti-fuse array units to program the additionally generated fail address at the searched valid anti-fuse array unit, without previous repair information indicating a location of a ruptured anti-fuse array unit.

The memory cell array may include: a normal cell block including the plurality of memory cells; and a spare cell block including a plurality of spare memory cells for repairing the memory cells.

The fuse programming circuit may include: a fuse row decoder configured to select a row of the anti-fuse array; a fuse column decoder configured to select a column of the anti-fuse array; a fuse sensing unit configured to sense whether the anti-fuse array units are ruptured; a decision circuit configured to search for the valid anti-fuse array unit in response to a fuse sensing signal of the fuse sensing unit; and a program controller connected to the fuse row decoder, the fuse column decoder and the decision circuit and configured to control programming on the valid anti-fuse array unit.

To search for the valid anti-fuse array unit, the fuse column decoder may be configured to apply a scanning voltage to a selected column of the anti-fuse array according to a control of the program controller.

For the programming on the valid anti-fuse, the fuse column decoder may be configured to apply a rupture voltage to a selected column of the valid anti-fuse array unit according to a control of the program controller.

The fuse row decoder may be configured to receive an enable signal from the program controller to search for the valid anti-fuse array unit and receive a hold signal from the program controller if the valid anti-fuse array unit is searched for.

If N different fail addresses, N being a natural number greater than or equal to 2, are additionally generated, the program controller may perform programming on the N different fail addresses in response to a command input.

According to an aspect of still another exemplary embodiment, there is provided a fuse programming method which may include: storing a fail address additionally generated after the fail address is programmed at an anti-fuse array having a plurality of anti-fuse array units for a memory cell repair; searching for a valid anti-fuse array unit of the anti-fuse array not used to program the fail address without previous repair information indicating a location of an anti-fuse array unit used to program the fail address; and programming the additionally generated fail address at the searched valid anti-fuse array unit if the valid anti-fuse array unit is searched.

The additionally generated fail address may be temporarily stored at a fail address memory.

The searched valid anti-fuse array unit may be an unused anti-fuse array unit not ruptured or fused.

The searched valid anti-fuse array unit may be ruptured by a program voltage.

If the valid anti-fuse array unit is searched for, a scanning operation for search may be held to program the searched valid anti-fuse array unit.

A voltage applied to a column of the anti-fuse array in the searching for the valid anti-fuse array unit may be different in level from a voltage applied to a column of the anti-fuse array in the programming the additionally generated fail address.

If N different fail addresses, N being a natural number greater than or equal to 2, are additionally generated, programming on the N different fail addresses may be performed in response to a command input.

If N different fail addresses, N being a natural number greater than or equal to 2, are additionally generated, programming on the N different fail addresses may be manually performed in response to N command inputs respectively corresponding to the N different fail addresses.

In the above fuse programming method, the fail address for the memory cell repair may be programmed at the anti-fuse array by rupturing a part of the plurality of anti-fuse array units.

The searching for the valid anti-fuse array unit may include: searching for a valid anti-fuse array unit which is not ruptured.

The programming the additionally generated fail address may include: programming the additionally generated fail address by rupturing the searched valid anti-fuse array unit if the valid anti-fuse array unit is searched.

The searching for the valid anti-fuse array unit which is not ruptured may include: selecting a row and a column of at least one anti-fuse array unit; and sensing whether the at least one anti-fuse array unit is ruptured.

The valid anti-fuse array unit may be programmed by selecting the row and the column of the valid anti-fuse and applying a program current to the valid anti-fuse array unit.

If N different fail addresses, N being a natural number greater than or equal to 2, are additionally generated, programming on the N different fail addresses may be performed in response to M command inputs, M being a natural number greater than or equal to 2.

If N different fail addresses, N being a natural number greater than or equal to 2, are additionally generated, programming on the N different fail addresses may be manually performed in response to N or less command inputs.

The searching and the programming may be automatically performed in a dynamic random access memory when the fail address is additionally generated.

The number of anti-fuses of the valid anti-fuse array unit may be more than a number of bits of the fail address.

BRIEF DESCRIPTION OF THE DRAWINGS

The above and other aspects will become apparent from the following description with reference to the following figures, in which.

DETAILED DESCRIPTION OF THE EXEMPLARY EMBODIMENTS

Figure 1:
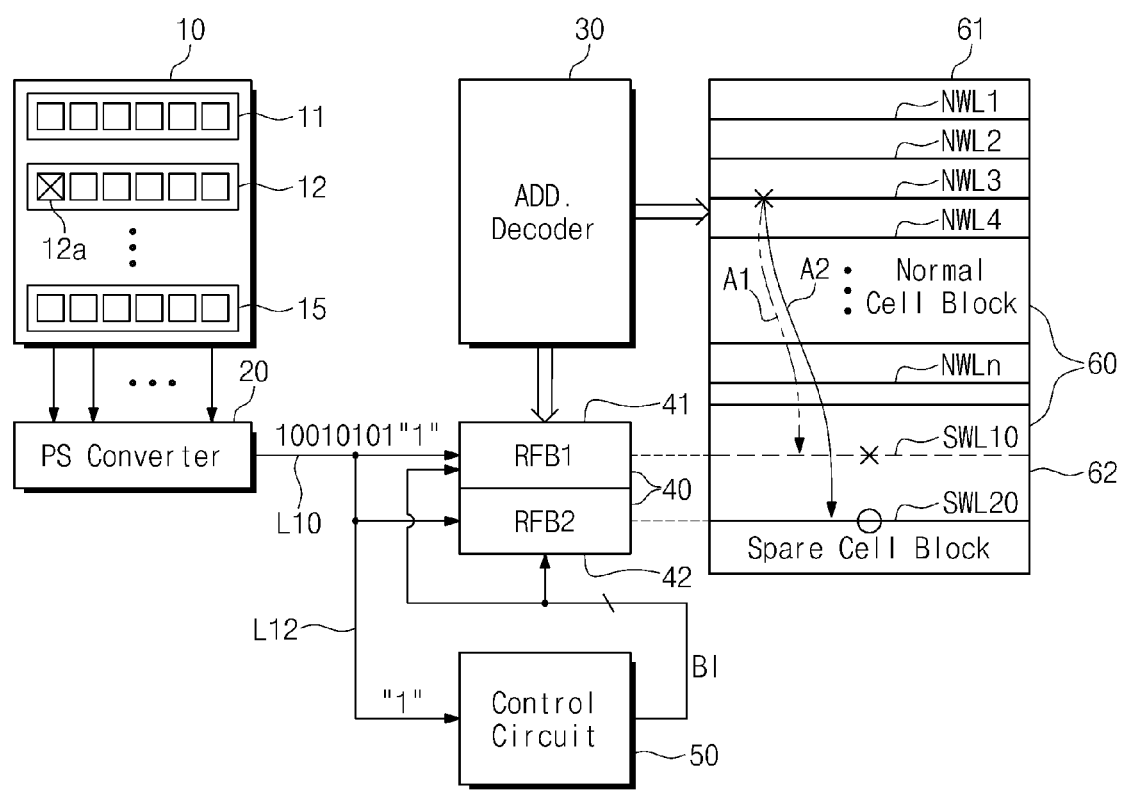
FIG. 1 is a block diagram schematically illustrating a semiconductor memory device according to an exemplary embodiment.

Exemplary embodiments will be described in detail with reference to the accompanying drawings. The inventive concept, however, may be embodied in various different forms, and should not be construed as being limited only to the illustrated embodiments. Rather, these embodiments are provided as examples to fully convey the inventive concept to those skilled in the art. Accordingly, known processes, elements, and techniques are not described with respect to some of the embodiments of the inventive concept. Unless otherwise noted, like reference numerals denote like elements throughout the attached drawings and written description, and thus descriptions will not be repeated. In the drawings, the sizes and relative sizes of layers and regions may be exaggerated for clarity.

It will be understood that, although the terms "first", "second", "third", etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the inventive concept.

Spatially relative terms, such as "beneath", "below", "lower", "under", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the exemplary terms "below" and "under" can encompass both an orientation of above and below. The device may be otherwise oriented (rotated 90 degrees or at other orientations) and the spatially relative descriptors used herein interpreted accordingly. In addition, it will also be understood that when a layer is referred to as being "between" two layers, it can be the only layer between the two layers, or one or more intervening layers may also be present.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Also, the term "exemplary" is intended to refer to an example or illustration.

It will be understood that when an element or layer is referred to as being "on", "connected to", "coupled to", or "adjacent to" another element or layer, it can be directly on, connected, coupled, or adjacent to the other element or layer, or intervening elements or layers may be present. In contrast, when an element is referred to as being "directly on," "directly connected to", "directly coupled to", or "immediately adjacent to" another element or layer, there are no intervening elements or layers present.

Unless otherwise defined, all terms (including technical and scientific terms) used herein have the same meaning as commonly understood by one of ordinary skill in the art to which this inventive concept pertains. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

Embodiments disclosed therein may include their complementary embodiments. Note that details of a fundamental data access operation, an anti-fuse program and repair operation, and an internal function circuit associated with a DRAM may be skipped to prevent the inventive concept from becoming ambiguous.

At a post package repair operation, defective memory cells may be replaced with redundancy memory cells by a row/column unit. To perform the post package repair operation, an anti-fuse circuit may be used as a program element for storing a defect address. For example, if defective memory cells are detected at a test level after a wafer is treated, addresses corresponding to defective memory cells may be programmed at the anti-fuse circuit. When a fail address, which is an address corresponding to a row/column including a defective memory cell, is received, a row/column including a redundancy memory cell instead of a row/column including the defective memory cell may be activated by the anti-fuse circuit.

In the event that memory cells are determined to be defective at a test operation, fail addresses for repairing the defective memory cells may be programmed by rupturing anti-fuses. New defective memory cells can exist at a test process following programming of the fail addresses or after product shipping.

If fail addresses are newly generated, it is necessary to additionally program the fail addresses newly generated. In this case, anti-fuses used to program previous fail addresses must be excluded at programming of fail addresses newly generated. It is necessary to know previous repair information in order to additionally program anti-fuses not used to store the previous repair information.

In the event that fail addresses are newly generated after fail addresses are programmed at a fuse array, dependency on previous repair information may require generating and obtaining of a database on previous repair information. Also, a test time and a test step for a repair operation may be increased.

FIG. 1 is a block diagram schematically illustrating a semiconductor memory device according to an exemplary embodiment of the inventive concept.

Referring to FIG. 1, a semiconductor memory device may include an anti-fuse array 10, a parallel-serial converter 20, an address decoder 30, a redundancy fuse box circuit 40, a control circuit 50, and a memory cell array 60.

The memory cell array 60 may include a normal cell block 61 having normal memory cells connected to normal word lines NWL1 to NWLn and a spare cell block 62 having redundancy memory cells connected to spare word lines SWL10 and SWL20.

The anti-fuse array 10 may have a plurality of anti-fuse array units 11 through 15. The anti-fuse array 10 may be configured to reprogram a fail address when a spare word line used to repair a defective normal word line is determined to be defective. The anti-fuse array 10 may also be configured to program an additional bit of the reprogrammed fail address.

The parallel-serial converter 20 may be configured to convert parallel fail sensing data from the anti-fuse array 10 into serial data.

The address decoder 30 may decode an input address to generate a decoded normal address.

The redundancy fuse box circuit 40 may compare the decoded normal address and the fail address. The redundancy fuse box circuit 40 may activate a spare word line when the decoded normal address is the same as the fail address.

At least one of redundancy memory cells connected with a spare word line used to repair a defective normal word line can be defective. In this case, the spare word line (referred to as first spare word line) determined to be defective may be replaced with another spare word line (referred to as a second spare word line). Also, at least one of redundancy memory cells connected with the second spare word line used to repair the first spare word line can be defective. Likewise, the second spare word line may be replaced with another spare word line (referred to as a third spare word line). Here, the first to third spare word lines may be used to repair a defective normal word line. Hereafter, the above-described fail phenomenon may be referred to as "multiple spare word line fail". The number of spare word lines associated with a defective normal word line may be two or more.

To prevent multiple spare word lines from being simultaneously activated at the time of the multiple spare word line fail, the redundancy fuse box circuit 40 may receive a priority signal and a blocking signal from the control circuit 50 according to additional bit information.

The control circuit 50 may be connected with the redundancy fuse box circuit 40, and may generate the priority signal and the blocking signal according to the additional bit information when two or more fail sensing data is received at a repair mode.

A spare word line SWL20 directed by the priority signal may be activated independently, and all spare word lines (e.g., SWL10) directed by the blocking signal may be inactivated.

As shown in FIG. 1, a normal word line NWL3 of the normal cell block 61 may be defective. Then, a row address corresponding to the normal word line NWL3 may be programmed as a fail address using an anti-fuse array unit 11 of the anti-fuse array 10. In this case, if a row address for selecting the normal word line NWL3 is received at a memory access operation, a spare word line SWL10 of the spare cell block 62 may be activated instead of the normal word line NWL3. As a result, a defective normal word line may be repaired by performing a repair operation once.

However, at least one redundancy memory cell connected to the spare word line SWL10 may also be bad. In this case, the spare word line SWL10 may be replaced with another spare word line SWL20.

In the event that the multiple spare word line fail is generated, two or more spare word lines SWL10 and SWL20 for replacing a defective normal word line may be activated. That is, since the same fail address is programmed using different anti-fuse array units 11 and 12 of the anti-fuse array 10, two spare word lines may be activated at the same time.

Since a memory access error is generated at multiple activation of spare word lines, multiple activation (e.g., simultaneous activation of two or more spare word lines) needs to be effectively prevented.

In FIG. 1, in the event that at least one redundancy memory cell connected with the spare word line SWL10 is defective, an additional bit 12a of the anti-fuse array unit 12 may be utilized. If the additional bit 12a of the anti-fuse array unit 12 is programmed using an anti-fuse, a logic level of "1" may be programmed as storage data of the additional bit.

If the additional bit is programmed, previous repair history information may be unnecessary.

In a case where a fail address is reprogrammed when a spare word line used to repair a defective normal word line or a defective spare word line is determined to be defective and an additional bit of the reprogrammed fail address is programmed, two or more fail sensing data may be received at a repair mode. In this case, one, having an additional bit of "1", from among the two or more sensing data received may be valid data directing a spare word line to be actually enabled.

That is, the control circuit 50 may generate the priority signal and the blocking signal according to the additional bit information applied through a line L12. The priority signal and the blocking signal may be applied to the redundancy fuse box circuit 40. The priority signal and the blocking signal may be signals included in bit information BI.

The blocking signal may be applied to a first redundancy fuse box 41, and the priority signal may be applied to a second redundancy fuse box 42. If an additional bit added to fail sensing data (e.g., "1001010" in FIG. 1) is "1", the priority signal may be generated. All fail sensing data not having an additional bit of "1" may be excluded from an activation operation.

At a repair mode, a spare word line SWL20 directed by the priority signal may be activated as marked by an arrow A2 and all spare word lines (e.g., SWL10) directed by the blocking signal may be disabled as marked by an arrow A1.

Accordingly, previous repair history information may be unnecessary since the additional bit is programmed. Thus, a test user performing a repair operation need not refer to a previous repair history. Also, it is unnecessary to generate a repair history database.

However, once an additional bit corresponding to any fail address is programmed with "1", it is difficult to further program another additional bit.

If the spare word line SWL20 is determined to be defective, information representing that a further repair is impossible may be stored at a separate storage element. The information stored at the separate storage element may be output outside the semiconductor memory device at a test or repair operation.

Figure 2:
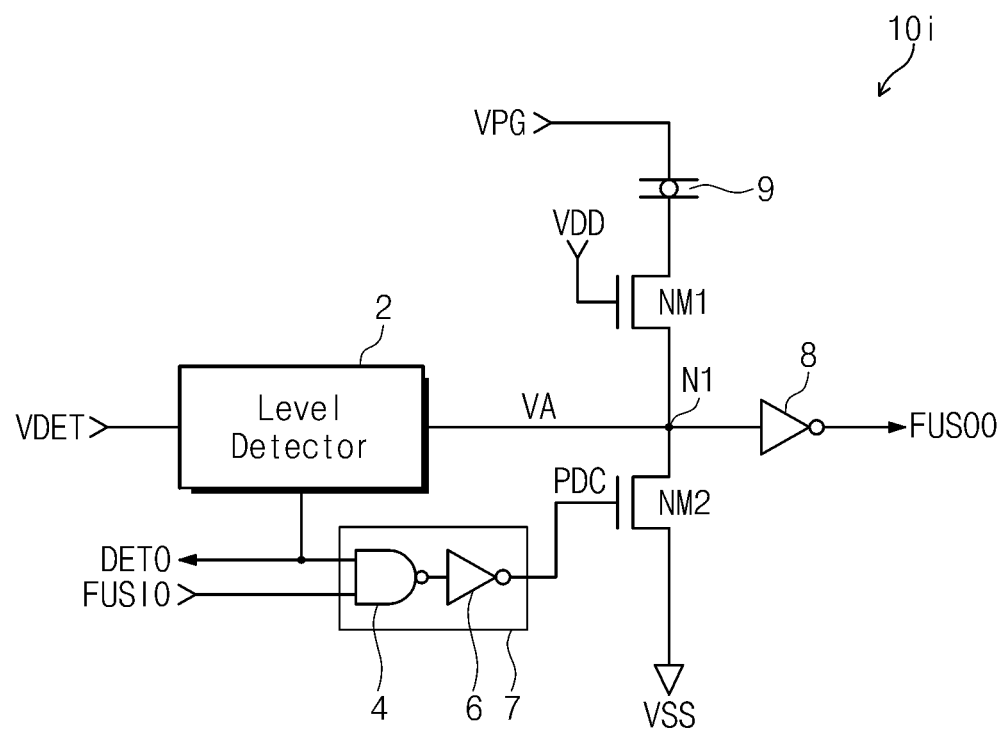
FIG. 2 is a circuit diagram of an anti-fuse of an anti-fuse array according to an exemplary embodiment.

FIG. 2 is a circuit diagram of an anti-fuse of an anti-fuse array according to an exemplary embodiment of the inventive concept.

Referring to FIG. 2, an anti-fuse circuit 10i may include an anti-fuse 9, a pull-up transistor NM1, a pull-down transistor NM2, a level detector 2, and a pull-down control circuit 7. Also, the anti-fuse circuit 10i may further include an inverter 8 to invert a voltage of a node N1.

The anti-fuse 9 may have a terminal connected to receive a program voltage VPG. The pull-up transistor NM1 may be connected between a second node of the anti-fuse 9 and the node N1, and may connect the node N1 to the program voltage VPG when the anti-fuse 9 is programmed.

The pull-down transistor NM2 may connect the node N1 to a ground voltage GND in response to a pull-down control signal PDC. The level detector 2 may compare a detection reference voltage and a voltage VA of the node N1 to generate a detection output signal DETO. The detection output signal DETO may have a voltage level of a logic "low" when the voltage VA of the node N1 is higher than the detection output signal DETO and a voltage level of a logic "high" when the voltage VA of the node N1 is lower than the detection output signal DETO.

The pull-down control circuit 7 may perform an AND operation on a fuse input signal FUSI0 and the detection output signal DETO to generate the pull-down control signal PDC. A fuse output signal FUSO0 may be a signal generated by inverting the voltage VA of the node N1 through the inverter 8.

In FIG. 2, there is illustrated an example where the anti-fuse 10i includes an inverter. However, an odd or even number of inverters can be added according a logic state required.

According to exemplary embodiments, an anti-fuse output signal may have a logic high at the time of programming of an additional bit.

Figure 3:
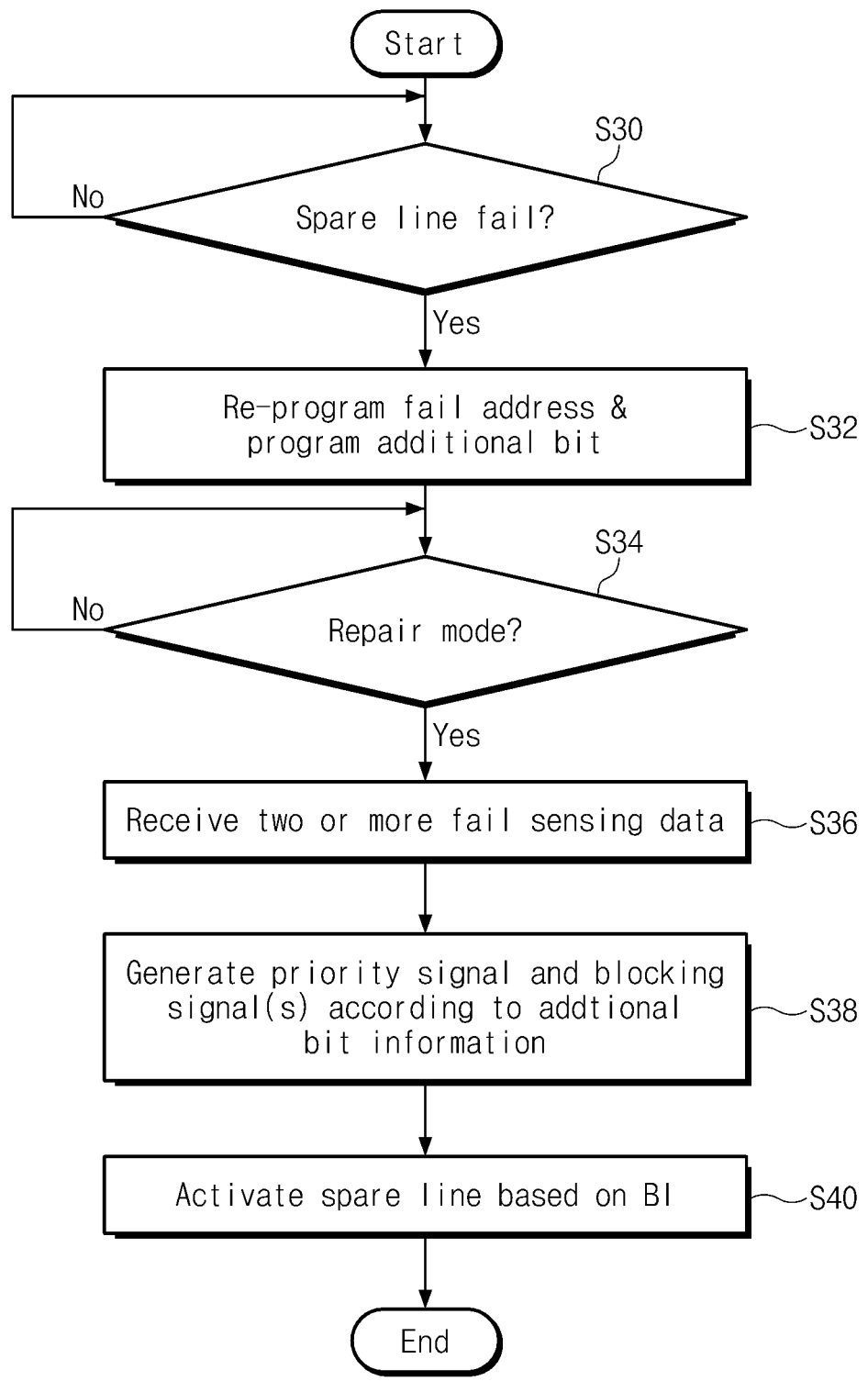
FIG. 3 is a flow chart schematically illustrating a multiple activation preventing method of a semiconductor memory device according to an exemplary embodiment.

FIG. 3 is a flow chart schematically illustrating a multiple activation preventing method of a semiconductor memory device according to an exemplary embodiment.

Referring to FIG. 3, a spare word line fail is determined in operation S30.

If it is determined that a spare word line fails, that is, a spare word line is defective, the method may proceed to operation S32. In operation S32, a fail address may be reprogrammed and an additional bit of the reprogrammed fail address may be programmed. That is, a fail address and an additional bit 12a (refer to FIG. 1) may be programmed at an anti-fuse array unit 12. Thus, an anti-fuse array unit 11 may be a program element for activating a spare word line SWL10, and the anti-fuse array unit 12 may be a program element for activating a spare word line SWL20.

Operation S34 may be an operation of determining if a current mode is a repair mode. In the event that a spare word line is defective, a separate operation to determine if the current mode is the repair mode is not necessary.

In operation S36, two or more fail sensing data may be received.

If two or more fail sensing data are received a parallel-serial converter 20, operation S38 may be performed.

In operation S38, a control circuit 50 may generate a priority signal and a blocking signal according to additional bit information.

In operation S40, a spare word line SWL20 directed by the priority signal may be activated, and all spare word lines (e.g., SWL10) directed by the blocking signal may be disabled.

A multiple activation preventing method described with reference to FIG. 3 may be executed without previous repair history information.

A memory cell connected with the spare word line may be a unit memory cell having an access transistor and a storage capacitor, and additional bit information may be formed of one or more bits.

Below, a multiple activation preventing method according to another exemplary embodiment of the inventive concept will be described.

According to this embodiment, simultaneous/multiple activation of spare word lines will be prevented using previous repair history information.

Figure 4:
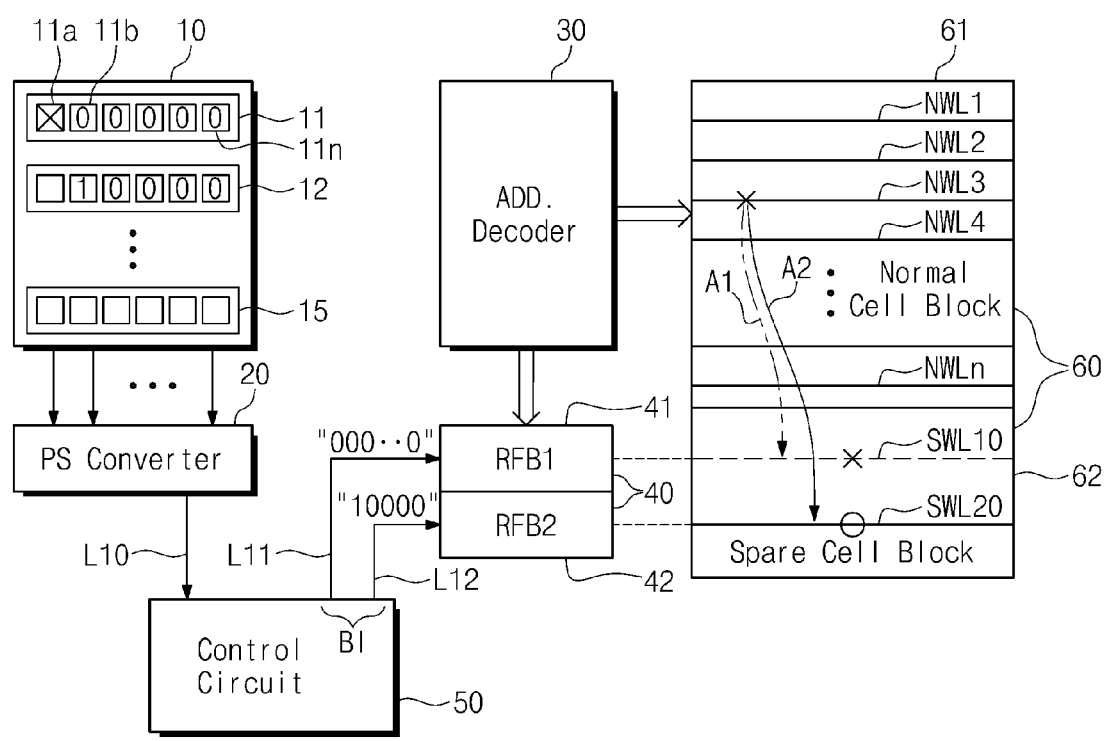
FIG. 4 is a block diagram schematically illustrating a semiconductor memory device according to another exemplary embodiment.
Figure 5:
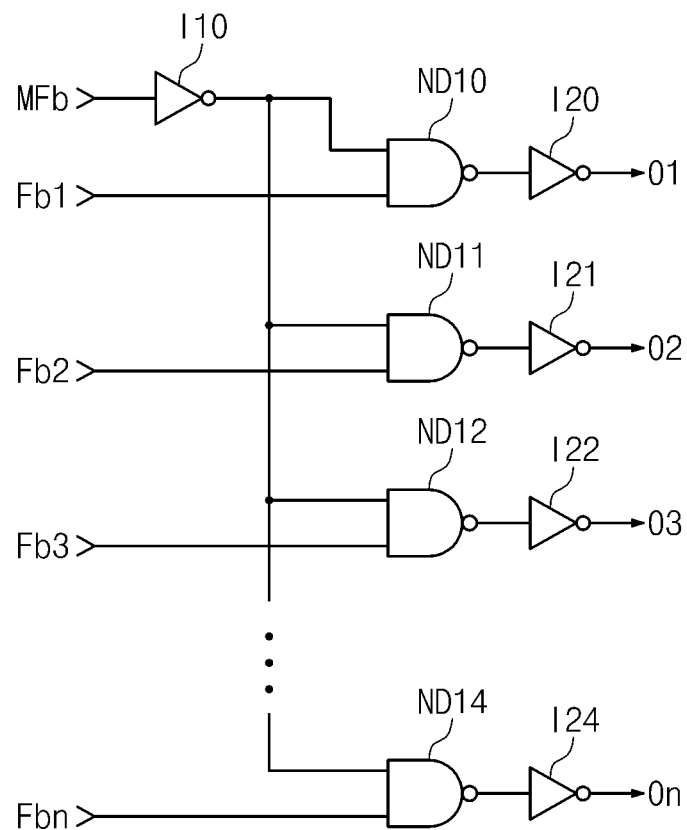
FIG. 5 is a detailed circuit diagram of a disable logic circuit of a control circuit of FIG. 4, according to an exemplary embodiment.
Figure 6:
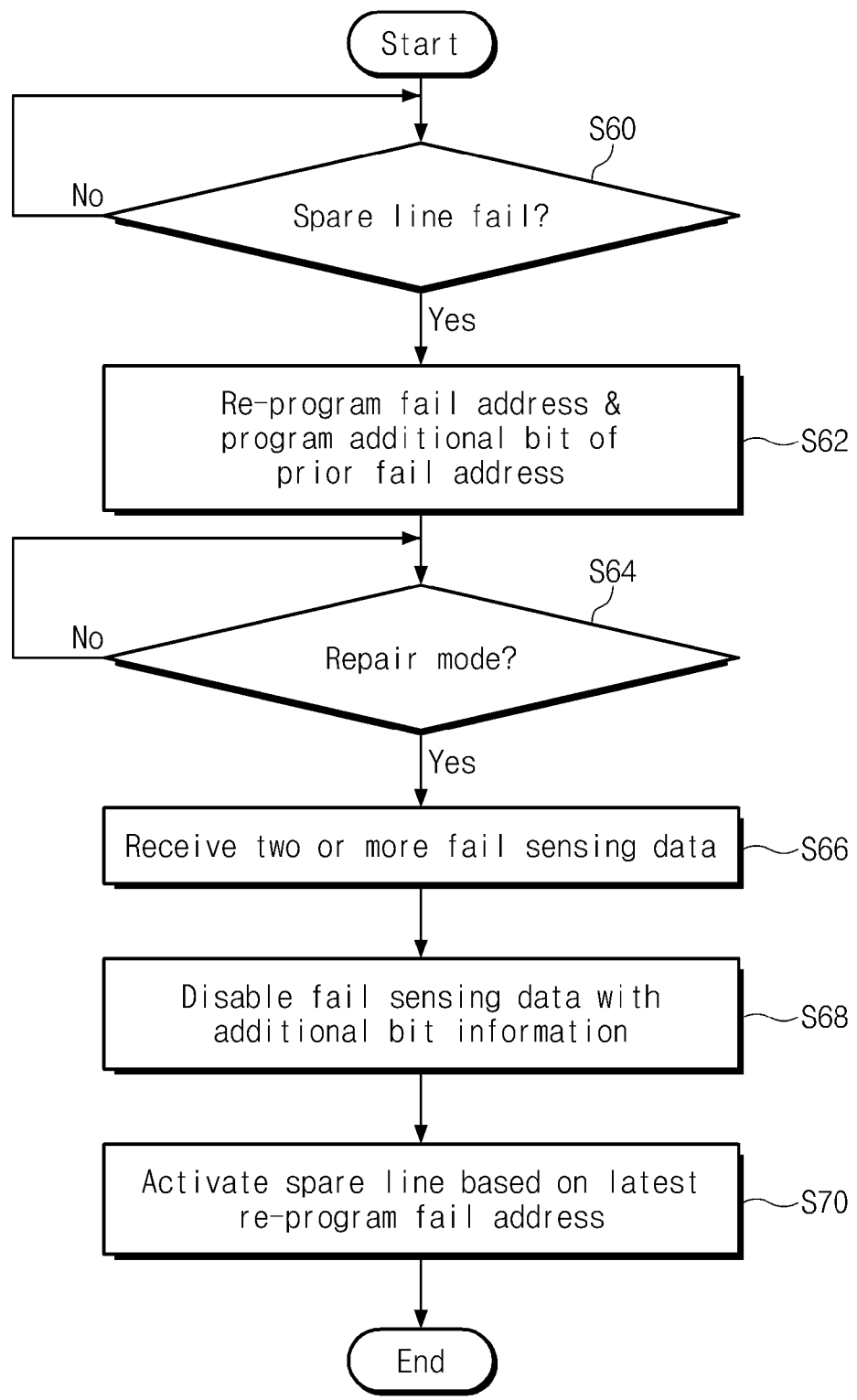
FIG. 6 is a flow chart schematically illustrating a multiple activation preventing method according to another exemplary embodiment.

FIG. 4 is a block diagram schematically illustrating a semiconductor memory device according to another exemplary embodiment. FIG. 5 is a detailed circuit diagram of a disable logic circuit of a control circuit of FIG. 4 according to an exemplary embodiment. FIG. 6 is a flow chart schematically illustrating a multiple activation preventing method according to an exemplary embodiment.

Referring to FIG. 4, a semiconductor memory device may include an anti-fuse array 10, a parallel-serial converter 20, an address decoder 30, a redundancy fuse box circuit 40, a control circuit 50, and a memory cell array 60.

The memory cell array 60 may include a normal cell block 61 having normal memory cells connected to normal word lines NWL1 to NWLn and a spare cell block 62 having redundancy memory cells connected to spare word lines SWL10 and SWL20.

The anti-fuse array 10 may have a plurality of anti-fuse array units 11 through 15. The anti-fuse array 10 may be configured to reprogram a fail address when a spare word line used to repair a defective normal word line is determined to be defective. The anti-fuse array 10 may also be configured to program an additional bit of the reprogrammed fail address.

The parallel-serial converter 20 may be configured to convert parallel fail sensing data from the anti-fuse array 10 into serial data.

The address decoder 30 may decode an input address to generate a decoded normal address.

The redundancy fuse box circuit 40 may compare the decoded normal address and the fail address. The redundancy fuse box circuit 40 may activate a spare word line when the decoded normal address is the same as the fail address.

When two or more fail sensing data is received at a repair mode, the control circuit 50 may disable fail sensing data having additional bit information and activate a spare word line directed by fail sensing data not having additional bit information.

For example, a spare word line SWL20 directed by the fail sensing data not having additional bit information may be activated, and all spare word lines (e.g., SWL10) directed by the fail sensing data having additional bit information may be inactivated.

As shown in FIG. 4, a normal word line NWL3 of the normal cell block 61 may be defective. Then, a row address for selecting the normal word line NWL3 may be programmed as a fail address using an anti-fuse array unit 11 of the anti-fuse array 10. If the fail address is programmed at anti-fuses 11b to 11n of the anti-fuse array unit 11, an anti-fuse 11a may be used as an additional anti-fuse. The anti-fuse 11a may be ruptured at the same time with programming of an anti-fuse array unit 12.

When a row address for selecting the normal word line NWL3 is received at a memory access operation, a spare word line SWL10 of the spare cell block 62 may be activated instead of the normal word line NWL3. As a result, a defective normal word line may be replaced with a spare word line by performing a repair operation once.

But, at least one redundancy memory cell connected to the spare word line SWL10 may be bad. In this case, the spare word line SWL10 may also be replaced with another spare word line SWL20.

In the event that the multiple spare word line fail is generated, two or more spare word lines SWL10 and SWL20 for replacing a defective normal word line may be activated. That is, since the same fail address is programmed using different anti-fuse array units 11 and 12 of the anti-fuse array 10, two spare word lines may be activated at the same time.

In FIG. 4, in the event that the multiple spare word line fail is generated, that is, at least one of redundancy memory cells connected with a spare word line is defective, an additional bit 11a of the anti-fuse array unit 11 may be utilized. If an additional bit 11a of the anti-fuse array unit 11 previously programmed is programmed using an anti-fuse at programming of the anti-fuse array unit 12, all bits of a fail address previously programmed may be "0" by a circuit operation of FIG. 5.

When a spare word line used to repair a defective normal word line is determined to be defective, previous repair history information may be required to reprogram a fail address and to program an additional bit of a fail address previously programmed.

As a result, at a repair mode of operation, fail sensing data, having an additional bit of "1", from among two or more fail sensing data may be data directing a spare word line to be disabled. An additional anti-fuse storing additional bit information may be used as a master fuse of a previously programmed fail address bit.

Thus, all bits of fail sensing data may indicate a logic low at the time of rupturing of the additional anti-fuse.

That is, the control circuit 50 may receive two fail addresses through a line L10. Since one of the received fail addresses corresponds to such a case that an additional anti-fuse is ruptured, "00000" may be output through a line L11. Since an additional anti-fuse is not ruptured, "10000" may be output through a line L12.

The driving data for disable on the line L11 may be applied to a first redundancy fuse box 41, and the driving data for enable on the line L12 may be applied to a second redundancy fuse box 42.

Fail sensing data whose additional bit is not programmed may be valid, and fail sensing data whose additional bit is programmed may be excluded from an activation operation.

At a repair mode, a spare word line SWL20 directed by fail sensing data not having additional bit information may be activated as marked by an arrow A2 and all spare word lines (e.g., SWL10) directed by fail sensing data having additional bit information may be disabled as marked by an arrow A1.

Thus, previous repair history information may be required when an additional bit is programmed. In FIG. 4, simultaneous activation of spare word lines may be prevented by programming an addition bit of a spare word line repaired when a spare word line used to repair a defective spare word line is defective. That is, it is possible to prevent simultaneous/multiple activation of spare word lines even in case that three or more spare word lines associated with a row address are defective.

As a result, if a spare word line SWL20 is detected to be defective, an additional bit of the anti-fuse array unit 12 may be programmed and an anti-fuse array unit 15 corresponding to another spare word line used to repair a defective spare word line may be programmed. This may mean that a multiple spare word line fail is cured regardless of a fail number according to the number of anti-fuse array units each having an additional bit.

Below, an example where fail address bits all are "0" at programming of an additional bit will be described with reference to FIG. 5.

Referring to FIG. 5, a disable logic circuit of a control circuit 50 may include a plurality of inverters I10, I20, I21, I22, and I24 and a plurality of NAND gates ND10, ND11, ND12, and ND14.

It is assumed that a fail address previously programmed before an additional bit 11a of an anti-fuse array unit 11 is programmed is "10000".

In the event that the additional bit 11a is not programmed, a master fuse bit signal MFb having a value of "0" may be applied. The master fuse bit signal MFb having a value of "0" may be applied in common to first input terminals of the NAND gates ND10, ND11, ND12, and ND14 through the inverter I10.

MSB data of the fail address, that is, "1" may be applied to a second input terminal of the NAND gate ND10 as a fuse bit signal Fb1.

Data of the fail address, that is, "0" may be applied to a second input terminal of the NAND gate ND11 as a fuse bit signal Fb2.

Data of the fail address, that is, "0" may be applied to a second input terminal of the NAND gate ND12 as a fuse bit signal Fb3.

LSB data of the fail address, that is, "0" may be applied to a second input terminal of the NAND gate ND14 as a fuse bit signal Fbn.

Thus, "01111" may be output from the NAND gates ND10, ND11, ND12, and ND14, and "10000" may be output through the inverters I20 to I24.

In the event that the additional bit 11a is not programmed, a fail address programmed may be output without modification.

If the additional bit 11a is programmed, a fail address programmed may be changed into "00000". The reason may be that the master fuse bit signal MFb is set to "1" at rupturing of an additional anti-fuse. If "0" is applied to the first input terminal of the NAND gate ND10, the NAND gate ND10 may output "1" regardless of a value of the second input terminal thereof. Thus, an output (i.e., "1") of the NAND gate ND10 may be inverted through the inverter I20 (i.e., the inverter I20 outputs a value of "0").

In a circuit of FIG. 5, if the inverter I10 outputs a value of "0", a data bit of "0" may be output from output terminals O1 to On, respectively.

Referring to FIG. 6, a spare word line fail is determined in operation S60.

If it is determined that a spare word line is defective, the method may proceed to operation S62. In operation S62, a fail address may be reprogrammed using an anti-fuse array unit 12 and an additional bit of a fail address previously programmed may be programmed using an additional anti-fuse 11a of an anti-fuse array unit 11.

Operation S64 may be an operation of determining if a current mode is a repair mode. In the event that a spare word line is defective, a separate operation to determine if the current mode is the repair mode may be skipped.

In operation S66, two or more fail sensing data may be received.

If two or more fail sensing data are received a parallel-serial converter 20, operation S68 may be performed.

In operation S68, fail sensing data, having additional bit information, from among the two or more fail sensing data may be disabled. That is, referring to FIG. 5, n bits (n being a natural number greater than or equal to 2) of fail sensing data having additional bit information all may have "0".

In operation S70, a spare word line SWL20 directed by fail sensing data not having additional bit information may be activated. As a result, a fail address recently programmed may be valid, and a fail address previously programmed may be invalidated by rupturing an additional anti-fuse.

As described with reference to FIG. 6, if previous repair history information is provided, the multiple activation preventing method may be iterated regardless of a fail number.

Post Package Repair

Below, there will be described a semiconductor memory device and a post package repair method capable of reducing time loss at a post package repair operation.

Figure 7:
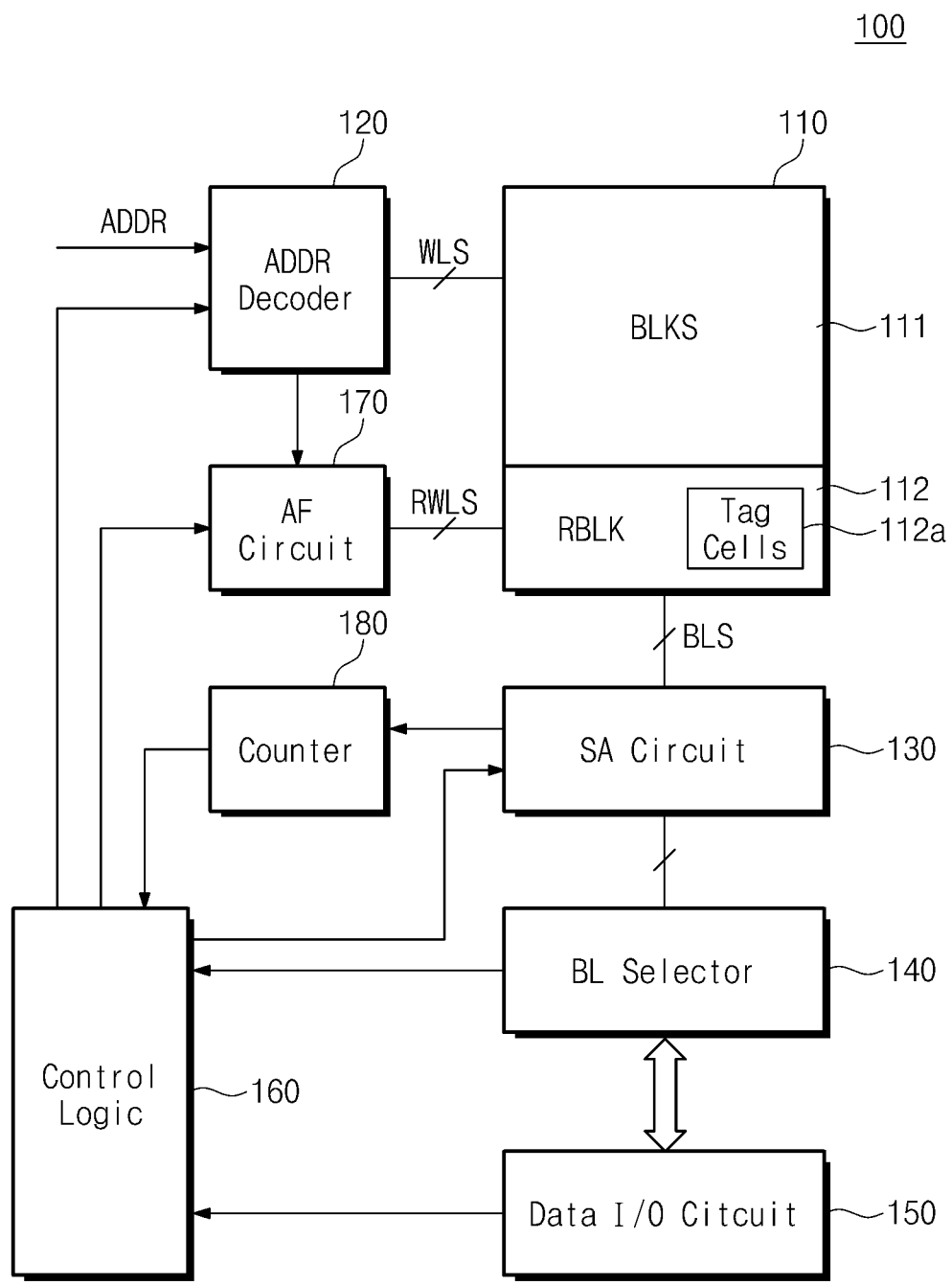
FIG. 7 is a block diagram schematically illustrating a semiconductor memory device according to still another exemplary embodiment.

FIG. 7 is a block diagram schematically illustrating a semiconductor memory device according to still another exemplary embodiment.

Referring to FIG. 7, a semiconductor memory device 100 may include a memory cell array 110, an address decoder 120, a sense amplifier circuit 130, a bit line selector 140, a data input/output circuit 150, a control logic 160, an anti-fuse circuit 170, and a counter 180.

The memory cell array 110 may include a memory block 111 having a plurality of memory cells connected to a plurality of word lines WLs and a redundancy block 112 having a plurality of redundancy memory cells connected to a plurality of redundancy word lines RWLs.

The memory block 111 may be connected to the address decoder 120 through the word lines WLs, and to the sense amplifier circuit 130 and the bit line selector 140 through a plurality of bit lines BLs. The redundancy block 112 may be connected to the anti-fuse circuit 170 through the redundancy word lines RWLs and to the sense amplifier circuit 130 and the bit line selector 140 through a plurality of bit lines BLs.

According to the exemplary embodiments, each of memory cells included in the memory cell array 110 may correspond to a word line and a bit line. Each of redundancy memory cells included in the memory cell array 110 may correspond to a redundancy word line and a bit line. The memory cell and the redundancy memory cell may store one or more bits according to a voltage or a current applied to a bit line, a word line, or a redundancy word line.

The redundancy block 112 may include a plurality of tag cells 112a respectively corresponding to the redundancy word lines RWLs. Each of the tag cells 112a may be used to store redundancy information indicating a use state of redundancy memory cells connected to a corresponding redundancy word line. For example, if redundancy memory cells connected to a redundancy word line are used to replace defective cells, a tag cell corresponding to the redundancy word line may be programmed to have a program state (data '0' storage state). On the other hand, in the event that redundancy memory cells connected to a redundancy word line are not used, a tag cell corresponding to the redundancy word line may not be programmed, that is, have an erase state (data '1' storage state). Thus, the semiconductor memory device 100 may decide a use state of redundancy memory cells by reading data stored at the tag cells 112a.

According to exemplary embodiments, the memory cells and the redundancy memory cells of the memory cell array 110 may be DRAM cells.

The address decoder 120 may be connected to the memory cell array 110 through the word lines WLs. The address decoder 120 may be configured to operate in response to control of the control logic 160. The address decoder 120 may be configured to decode a row address received from an external device. The address decoder 120 may select the word lines WLs using a decoded row address.

According to exemplary embodiments, the address decoder 120 may provide the decoded row address to the anti-fuse circuit 170.

The sense amplifier circuit 130 may operate according to control of the control logic 160. The sense amplifier circuit 130 may be configured to read memory cells connected to bit lines selected by the bit line selector 140 and a word line selected by the address decoder 120. Alternatively, the sense amplifier circuit 130 may be configured to read redundancy memory cells connected to bit lines selected by the bit line selector 140 and a redundancy word line selected by the anti-fuse circuit 170. The sense amplifier circuit 130 may sense currents flowing through the selected bit lines or voltages of the selected bit lines to read the memory cells or the redundancy memory cells. The sense amplifier circuit 130 may output the read data to the data input/output circuit 150.

According to exemplary embodiments, the sense amplifier circuit 130 may read redundancy information stored at the tag cells 112a to provide the read redundancy information to the counter 180.

The bit line selector 140 may be connected to the memory cell array 110 through the sense amplifier circuit 130. The bit line selector 140 may select the bit lines BLs in response to control of the control logic 160. At a program operation, the bit line selector 140 may select the bit lines BLs to activate memory cells or redundancy memory cells to be programmed. At a read operation, the bit line selector 140 may select the bit lines BLs to activate memory cells or redundancy memory cells to be read.

The data input/output circuit 150 may operate according to control of the control logic 160. The data input/output circuit 150 may transfer externally provided data to the bit line selector 140, and may output data input through the sense amplifier circuit 130 to an external device.

The counter 180 may calculate the number of usable redundancy bits based on the redundancy information read through the sense amplifier circuit 130. For example, redundancy information read from the tag cells 112a may indicate whether redundancy memory cells corresponding to the tag cells 112a are at a usable state or at such a used state that it is used to replace defective cells. The counter 180 may calculate the number of usable redundancy memory cells or the number of usable redundancy bits (hereinafter, referred to as a usable bit number or the number of usable bits), based on the redundancy information. Here, the usable bit number may mean the number of defective bits to be replaced using usable redundancy memory cells. For example, redundancy memory cells connected with a redundancy word line may be needed to replace one defective data bit. At this time, if redundancy memory cells connected with three redundancy word lines are usable, the usable bit number may be three.

The counter 180 may provide the control logic 160 with the number of usable redundancy memory cells or the usable bit number thus calculated.

The control logic 160 may control an overall operation of the semiconductor memory device 100. The control logic 160 may operate a command and a control signal received from an external device. If defective cells are generated from the memory block 111, the control logic 160 may control a post package repair operation on the defective cells in response to a post package repair command. At this time, the control logic 160 may decide whether to perform a post package repair operation based on the number of usable redundancy memory cells or the usable bit number.

For example, the control logic 160 may compare a defective bit number generated and the usable bit number. Here, the defective bit number may mean the number of defective data bits respectively corresponding to the defective cells generated. For example, assuming that the number of defective cells generated is three and one bit data is stored at each defective cell, the defective bit number may be three.

If the usable bit number is greater than the defective bit number, the post package repair operation may be successfully completed. Thus, the control logic 160 may perform the post package repair operation in response to the post package repair command.

If the usable bit number is less than the defective bit number, the number of redundancy memory cells required may be insufficient. For this reason, it is impossible to perform the post package repair operation successfully. Thus, the control logic 160 may not perform the post package repair operation, and may output a fail message, indicating that execution of the post package repair command is impossible, to the external device.

The anti-fuse circuit 170 may operate according to control of the control logic 160. When a post package repair operation is executed by the control logic 160, the anti-fuse circuit 170 may program address information (hereinafter, referred to as a defective line) on a row including a defective cell as a fail address. The anti-fuse circuit 170 may set one of rows (hereinafter, referred to as redundancy lines) including redundancy memory cells to a redundancy line used to replace a defective line.

If an input address ADDR coincides with a fail address, the anti-fuse circuit 170 may activate not a defective line but a set redundancy line, based on a decoded row address provided from the address decoder 120.

The above embodiments have described that a post package repair operation on a defective cell is performed by a row unit. However, the inventive concept is not limited thereto. For example, a post package repair operation on a defective cell can be performed by a column unit. In this case, the anti-fuse circuit 170 may program address information on a column including the defective cell and repair the column including the defective cell using one of columns including redundancy memory cells.

For example, memory cells included in a defective line may be electrically connected to the same word line. Likewise, redundancy memory cells included in a redundancy line may be electrically connected to a redundancy word line.

As described above, prior to a post package repair operation, the semiconductor memory device 100 may in advance determine whether it is possible to complete a post package repair operation successfully, based on a usable bit number. In the event that it is impossible to complete a post package repair operation successfully, the semiconductor memory device 100 may manage a post package repair command not to be executable without execution of the post package repair operation. In this case, it is possible to prevent time and resource loss caused by a post package repair operation performed when it is impossible to complete a post package repair operation successfully.

For example, if a defective bit number is 10 and a usable bit number is nine, a typical semiconductor memory device may perform a post package repair operation in response to a post package repair command. In this case, after a post package repair operation on nine bits is performed, such a state that it is impossible to perform a post package repair operation may be determined through a verification operation. Thus, a time and a resource may be unnecessarily used due to a post package repair operation impossible.

On the other hand, the semiconductor memory device according to the above embodiment may in advance determine whether it is possible to perform a post package repair operation successfully. A post package repair operation may be performed only when it is possible to perform a post package repair operation successfully. Thus, it is possible to prevent a time and a resource from being used unnecessarily by a post package repair operation impossible.

Figure 8:
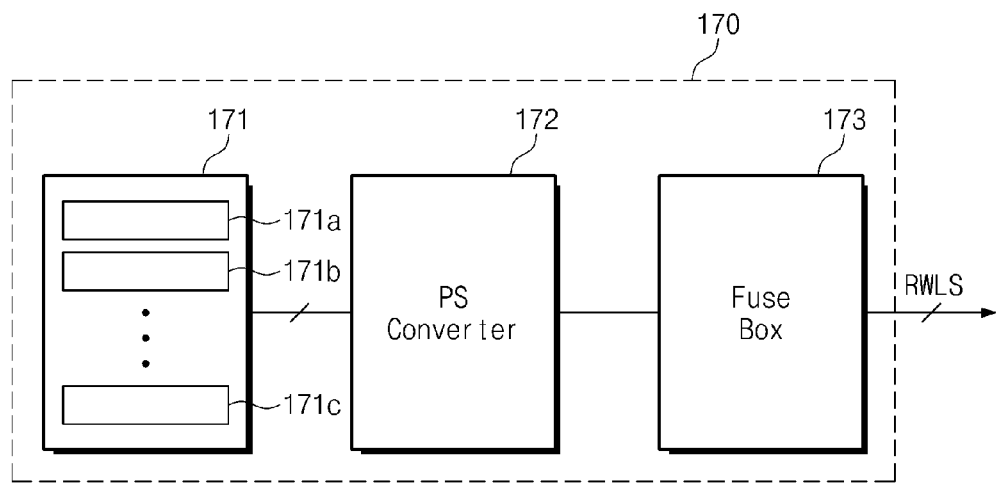
FIG. 8 is a block diagram schematically illustrating an anti-fuse circuit of FIG. 7, according to an exemplary embodiment.

FIG. 8 is a block diagram schematically illustrating an anti-fuse circuit of FIG. 7, according to an exemplary embodiment.

Referring to FIG. 8, an anti-fuse circuit 170 may include an anti-fuse array 171, a parallel-serial converter 172, and a fuse box 173.

The anti-fuse array 171 may include a plurality of anti-fuse array units 171a to 171c. When a post package repair operation is executed, the anti-fuse array 171 may program an address associated with a defective line including a defective cell as a fail address using the anti-fuse array units 171a to 171c.

The parallel-serial converter 172 may convert parallel fail sensing data output from the anti-fuse array 171 into serial data.

The fuse box 173 may compare an input address and a fail address based on a decoded row address provided from an address decoder 120. If the input address coincides with the fail address, the fuse box 173 may activate a redundancy word line such that a redundancy line is selected instead of a defective line.

As described above, if an input address is the same as a fail address, the anti-fuse circuit 170 may activate a redundancy word line used to repair a word line corresponding to the fail address. Thus, a defective line including a defective cell may be repaired using a redundancy line.

Figure 9:
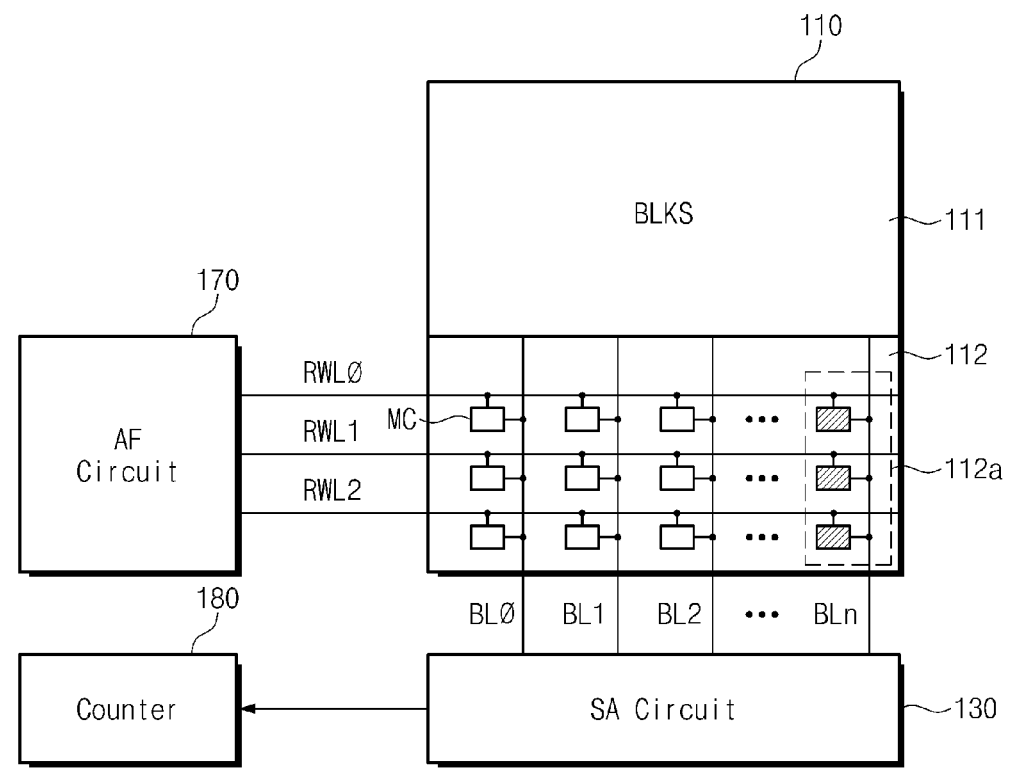
FIG. 9 is a block diagram for describing a post package repair method according to an exemplary embodiment.

FIG. 9 is a block diagram for describing a post package repair method according to an exemplary embodiment of the inventive concept.

Referring to FIG. 9, as a structure for calculating a usable bit number, there are illustrated a memory cell array 110 including a redundancy block 112, an anti-fuse circuit 170, a sense amplifier circuit 130, and a counter 180.

The redundancy block 112 may be connected to the anti-fuse circuit 170 through a plurality of redundancy word lines RWL0, RWL1, and RWL2. Redundancy memory cells of the redundancy block 112 may be connected to the redundancy word lines RWL0, RWL1, and RWL2 by a row unit. Memory cells connected with a redundancy word line may form a redundancy line.

Each of the redundancy word lines RWL0, RWL1, and RWL2 may be connected with a tag cell 112a indicating a use state of redundancy cells connected with a corresponding redundancy word line. The tag cells 112a may store redundancy information indicating use states of redundancy cells connected with corresponding redundancy word lines. For example, in the event that redundancy cells connected with a first redundancy word line RWL0 are used to repair a defective cell, a tag cell connected with the first redundancy word line RWL0 may be programmed to have a program state (data '0' storage state). On the other hand, in the event that redundancy cells connected with a second redundancy word line RWL1 are not used to repair a defective cell, a tag cell connected with the second redundancy word line RWL1 may be at an erase state (data '1' storage state).

The sense amplifier circuit 130 may read redundancy information (or, a program state) stored at the tag cells 112a to provide the read redundancy information to the counter 180.

The counter 180 may calculate a usable bit number based on the read redundancy information. For example, the counter 180 may calculate the usable bit number by counting tag cells, having an erase state (data '1' storage state), from among the tag cells 112a. In a case where a redundancy line repairs a defective data bit, the usable bit number may be the same as the number of tag cells each having an erase state. On the other hand, in the event that a redundancy line repairs two defective data bits, the usable bit number may be two times the number of tag cells each having an erase state. Here, the redundancy line may mean a row of redundancy memory cells connected with a redundancy word line.

Accordingly, the counter 180 may calculate a usable bit number based on redundancy information stored at the tag cells 112a. The usable bit number calculated may be provided to control logic 160 (refer to FIG. 7), and the control logic 160 may determine whether it is possible to perform a post package repair operation successfully, based on the usable bit number calculated.

Figure 10:
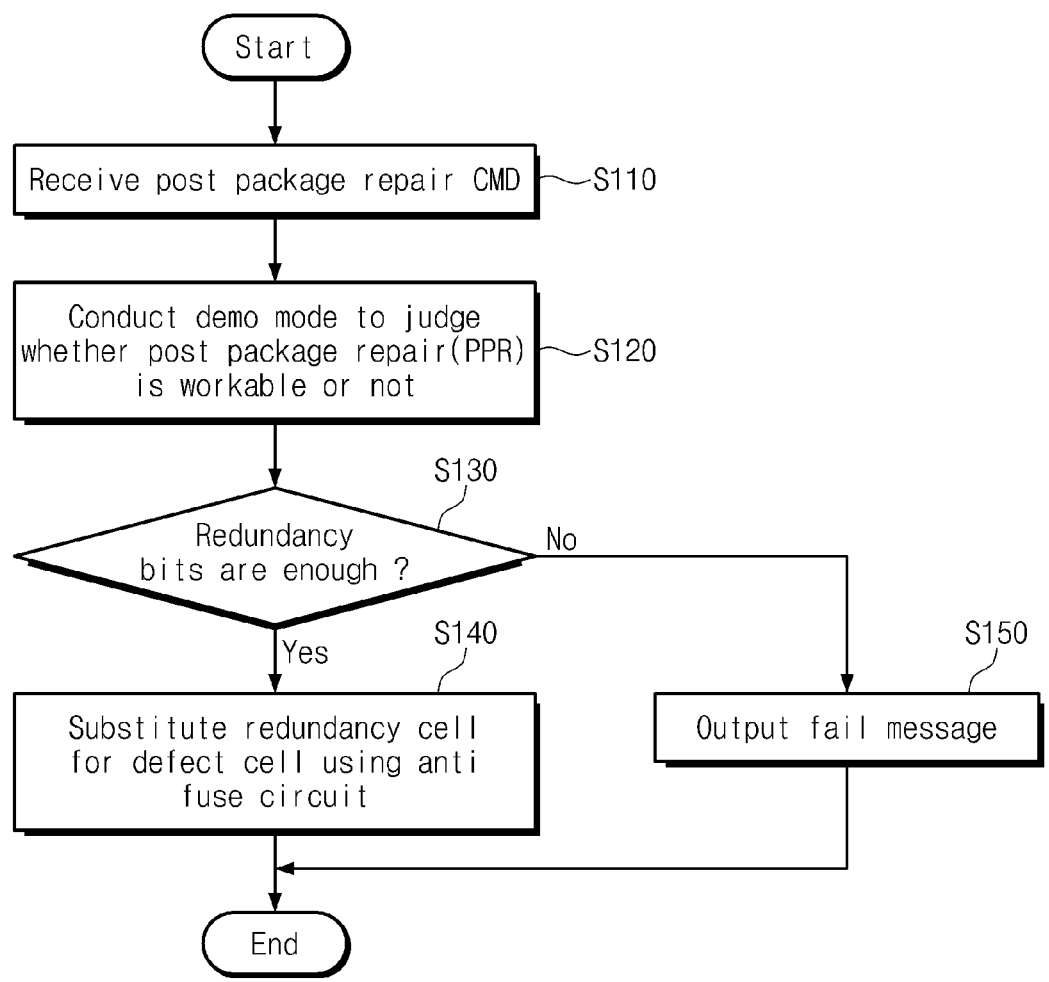
FIG. 10 is a flow chart schematically illustrating a post package repair method according to an exemplary embodiment.

FIG. 10 is a flow chart schematically illustrating a post package repair method according to an exemplary embodiment of the inventive concept.

Referring to FIG. 10, a post package repair method according to an exemplary embodiment of the inventive concept may include operations S110 to S150.

In operation S110, the semiconductor memory device 100 (refer to FIG. 7) may receive a post package repair command. Here, the post package repair command can be provided from an external controller (not shown) or a host (not shown). Alternatively, the post package repair command may be internally generated by the semiconductor memory device 100.

In operation S120, the semiconductor memory device 100 may respond to the post package repair command to perform a demo mode for determining whether a post package repair operation is executable. The demo mode may be performed as a pre-operation before the post package repair operation is executed. At the demo mode, the semiconductor memory device 100 may read the tag cells 112a of the redundancy block 112 (refer to FIG. 7) to calculate a usable bit number or the number of usable bits of the redundancy block 112.

The semiconductor memory device 100 may compare a defective bit number as a post package repair target and a usable bit number.

Here, meaning of the defective bit number and the usable bit number may be the same as described above. That is, the defective bit number may be the number of defective data bits respectively corresponding to the defective cells, and the usable bit number may be the number of usable redundancy bits.

In operation S130, the semiconductor memory device 100 may determine whether the usable bit number is enough, that is, whether usable redundancy bits are enough. If the usable bit number is determined to be greater than the defective bit number in operation S130, redundancy memory cells, that is, usable redundancy bits may be enough. Thus, a post package repair operation may be successfully completed. On the other hand, if the usable bit number is determined to be less than the defective bit number in operation S120, redundancy memory cells may not be enough. Thus, it is impossible to successfully complete the post package repair operation.

Thus, if the usable bit number is enough (or, the usable bit number is greater than the defective bit number), the method may proceed to operation S140. If not, the method may proceed to operation S150.

In operation S140, the semiconductor memory device 100 may replace a defective cell with a redundancy memory cell using the anti-fuse circuit 170 (refer to FIG. 7) to repair the defective cell. A method where the semiconductor memory device 100 repairs a defective cell using the anti-fuse circuit 170 may be the same as described above.

In operation S150, the semiconductor memory device 100 may output a fail message indicating that the post package repair command is not executable. For example, the fail message may be output to the external controller or the host.

As described above, a post package repair method of the semiconductor memory device 100 may in advance determine whether it is possible to successfully complete a post package repair operation, based on a usable bit number prior to execution of the post package repair operation on defective cells. If it is impossible to successfully complete a post package repair operation, the post package repair command may be managed not to be executable without performing a post package repair operation. In this case, there may be prevented time and resource loss generated when a post package repair operation is performed with the post package repair operation being not completed successfully.

Figure 11:
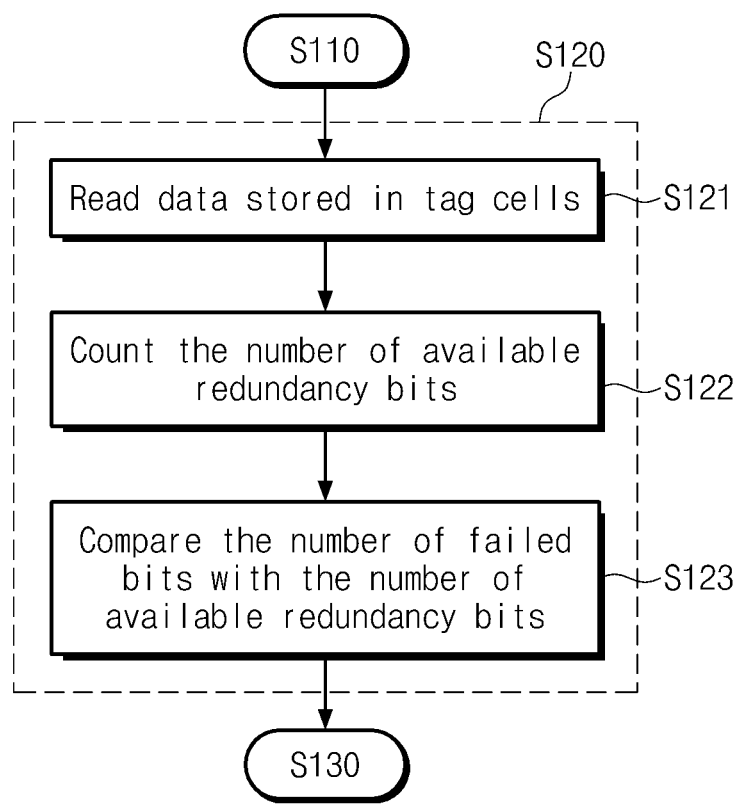
FIG. 11 is a detailed flow chart of operation S120 of FIG. 10, according to an exemplary embodiment.

FIG. 11 is a detailed flow chart of operation S120 of FIG. 10, according to an exemplary embodiment.

Referring to FIG. 11, operation S120 may include operations S121 to S123.

After operation S110 is performed, a post package repair method may proceed to operation S121.

In operation S121, the semiconductor memory device 100 may read data stored at the tag cells 112a of the redundancy block 112 (refer to FIG. 7) as redundancy information. Here, the redundancy information may indicate a use state of redundancy lines (or, redundancy memory cells) corresponding to the tag cells 112a. A detailed description on the redundancy information may be the same as described above.

For example, the sense amplifier circuit 130 (refer to FIG. 7) of the semiconductor memory device 100 may read the redundancy information.

In operation S122, the semiconductor memory device 100 may calculate a usable bit number based on the read redundancy information.

For example, the counter 180 of the semiconductor memory device 100 may calculate the usable bit number. A detailed method of calculating the usable bit number may be the same as described above.

In operation S123, the semiconductor memory device 100 may compare the usable bit number and a defective bit number to determine whether a post package repair operation is executable.

If operation S123 is ended, the post package repair method may proceed to operation S130.

Semiconductor Memory Device with Fuse Program Circuit

Below, a semiconductor memory device with a fuse program circuit and a fuse program method thereof will be described.

Figure 12:
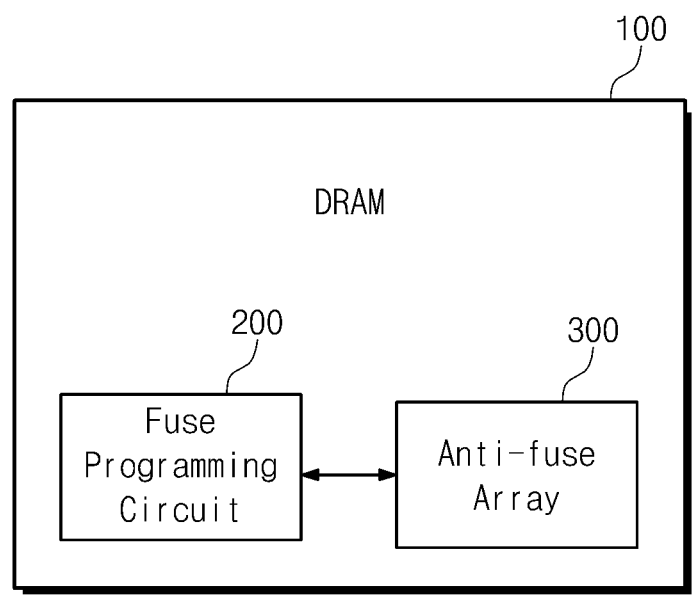
FIG. 12 is a block diagram schematically illustrating a semiconductor memory device according to still another exemplary embodiment.

FIG. 12 is a block diagram schematically illustrating a semiconductor memory device according to still another exemplary embodiment of the inventive concept.

Referring to FIG. 12, a semiconductor memory device 100 such as a DRAM may include a fuse programming circuit 200 and an anti-fuse circuit 300.

The semiconductor memory device 100 may include a memory cell array including a plurality of memory cells to perform a data read operation and a data write operation.

The anti-fuse circuit 300 may include a plurality of anti-fuse array units for programming fail addresses corresponding to defective memory cells of the memory cell array.

In the event that a fail address is additionally generated after a fail address is programmed at the anti-fuse circuit 300 by rupturing a part of anti-fuses in an anti-fuse array unit, the fuse programming circuit 200 may search for valid anti-fuse array units, not ruptured, from among the plurality of anti-fuse array units without previous repair information indicating locations of the ruptured anti-fuse array units. The fuse programming circuit 200 may program the fail address additionally generated at the searched valid anti-fuse array units.

After anti-fuse array units are programmed, a fail address may be additionally generated due to an additional defect of a memory cell. In this case, it is necessary to additionally program an anti-fuse array unit. At additional fuse programming, valid redundancy anti-fuse array units not used at a previous repair must be searched for to prevent anti-fuse array units used at the previous repair from being programmed. Therefore, previous repair information indicating locations of anti-fuse array units used for the previous repair may be required to additionally program anti-fuse array unit. Such previous repair information may be obtained by generating and managing a database.

However, the fuse programming circuit 200 of FIG. 12 may have a function of searching for valid anti-fuse array units, not used at a previous repair, from among a plurality of anti-fuse array units and programming a fail address additionally generated at the valid anti-fuse array units as searched. Thus, it is unnecessary to secure previous repair information.

Also, at reprogramming, a plurality of program operations may be performed in response to a command input. This may mean that programming time and test step are reduced.

Figure 13:
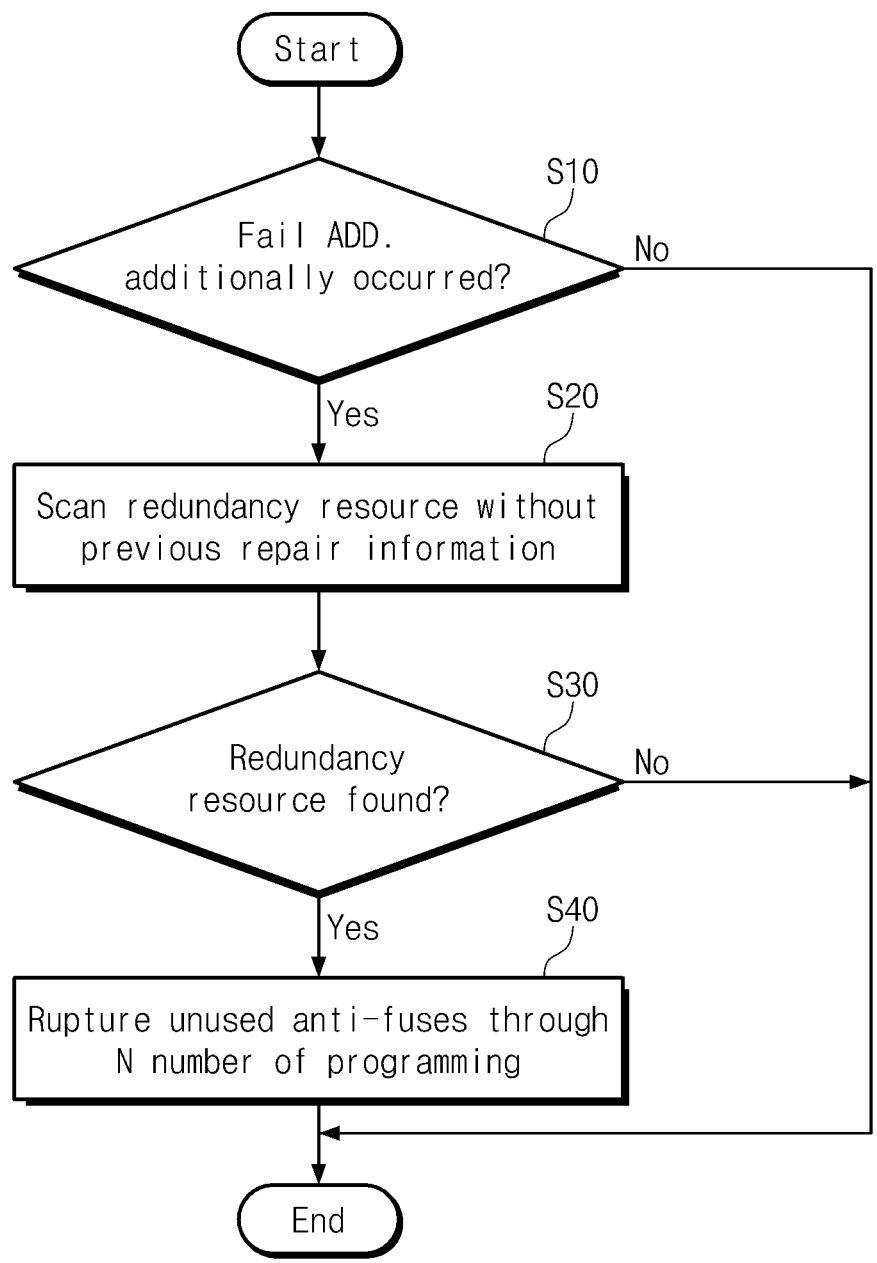
FIG. 13 is an operating control flow chart of a fuse programming circuit of FIG. 12, according to an exemplary embodiment.

FIG. 13 is an operating control flow chart of a fuse programming circuit of FIG. 12, according to an exemplary embodiment.

Referring to FIG. 13, in operation S10, whether a fail address additionally occurs or is additionally generated may be determined. That a fuse programming circuit 200 is activated and another fail address is received may mean that a fail address, that is, another fail address is additionally generated.

If a fail address is additionally generated, in operation S20, the fuse programming circuit 200 may scan a redundancy resource without previous repair information. This redundancy resource may mean anti-fuse array unit not participating in previous programming of a fail address.

In operation S30, it is determined whether the redundancy resource is searched and found may be checked. If so, the method may proceed to operation S40. If not, the method may be terminated.

In operation S40, the fuse programming circuit 200 may program the other fail address at the redundancy resource. That is, in operation S40, unused anti-fuse array units may be ruptured. In the event that the number of fail addresses additionally generated is N (N being a natural number greater than or equal to 2), the searching and programming may be performed at the same time.

Figure 14:
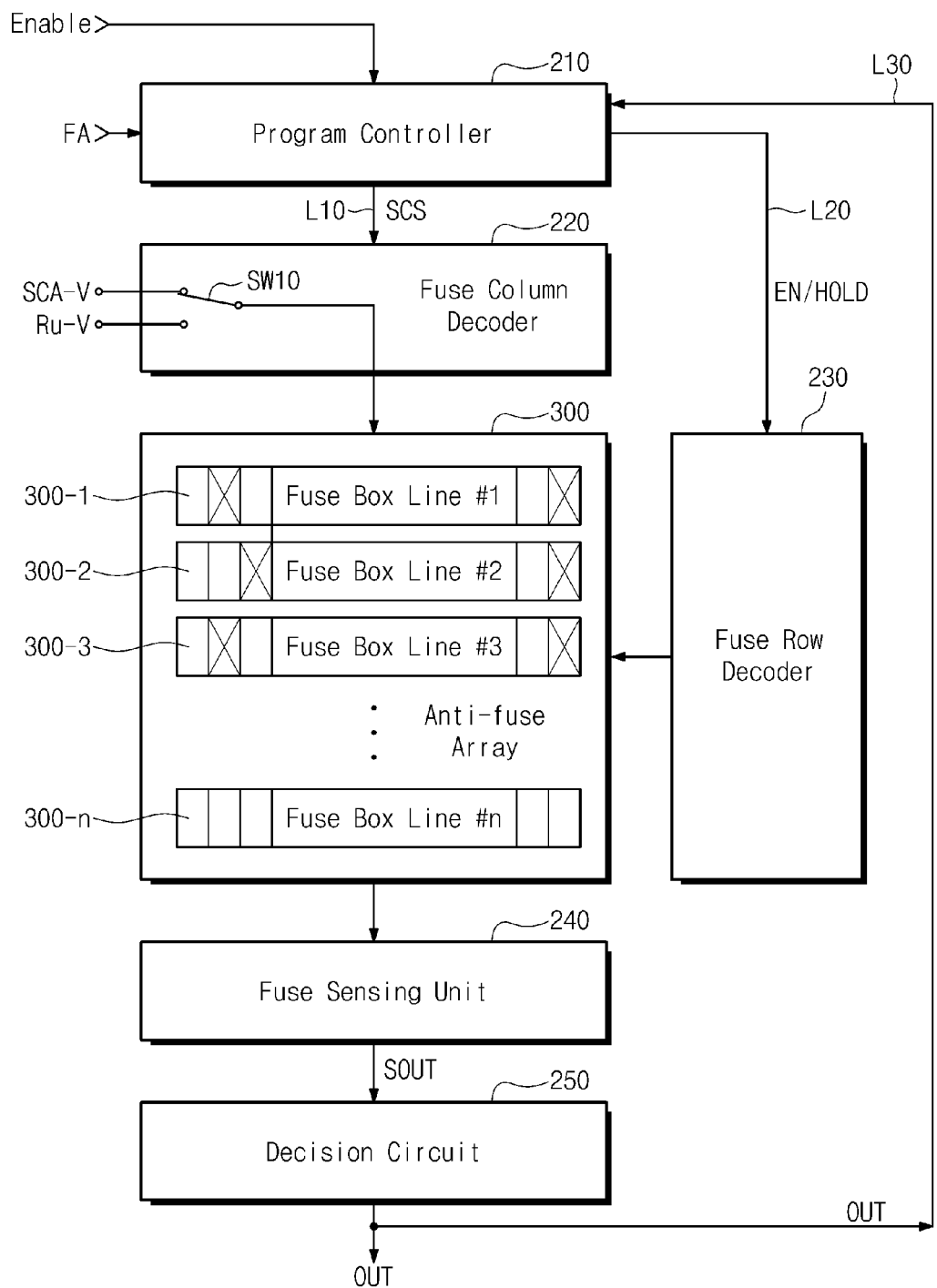
FIG. 14 is a block diagram schematically illustrating a fuse programming circuit of FIG. 12, according to an exemplary embodiment.

FIG. 14 is a block diagram schematically illustrating a fuse programming circuit of FIG. 12, according to an exemplary embodiment.

Referring to FIG. 14, a fuse programming circuit 200 may include a fuse row decoder 230, a fuse column decoder 220, a fuse sensing unit 240, a decision unit 250, and a program controller 210.

The fuse row decoder 230 may select a row of anti-fuses of an anti-fuse array 300.

The fuse column decoder 220 may select a column of anti-fuses of the anti-fuse array 300.

The fuse sensing unit 240 may sense rupturing of the anti-fuses.

The decision circuit 250 may search for valid anti-fuses of the anti-fuses in response to a fuse sensing signal of the fuse sensing unit 240.

The program controller 210 may be connected to the fuse row decoder 230, the fuse column decoder 220, and the decision circuit 250, and may control an anti-fuse search operation and a valid anti-fuse program operation.

The anti-fuse array 300 may include a plurality of fuse box lines 300-1 to 300-n. A fuse box line 300-1 may be used to program a fail address. The fuse box line 300-1 through 300-n correspond to the anti-fuse array units 11 through 15 in FIGS. 1 and 4.

For example, the fuse box lines 300-1 to 300-3 may have been used for previous repair operations. In the event that a fail address is additionally generated, the semiconductor memory device 100 may generate an enable signal Enable. Thus, the program controller 210 may be activated to receive a fail address FA. The fail address FA may be a fail address to be additionally programmed, and can be in plurality. The fail address FA may be stored at a fail address memory of the program controller 210. The fail address memory may be a storage register.

The program controller 210 may control an automatic redundancy resource scan operation without previous repair information. To search for unused anti-fuses not participating in previous programming of a fail address, the program controller 210 may apply an enable signal EN to the fuse row decoder 230 through a line L20. The program controller 210 may apply a scanning control signal SCS to the fuse column decoder 220 through a line L10. With this condition, a switch S10 of the fuse column decoder 220 may apply a scan voltage SCA-V to a selected column of the anti-fuse array 300. Also, the fuse row decoder 230 may generate activation pulses for sequentially activating the fuse box lines 300-1 to 300-n as illustrated in FIG. 16.

Figure 16:
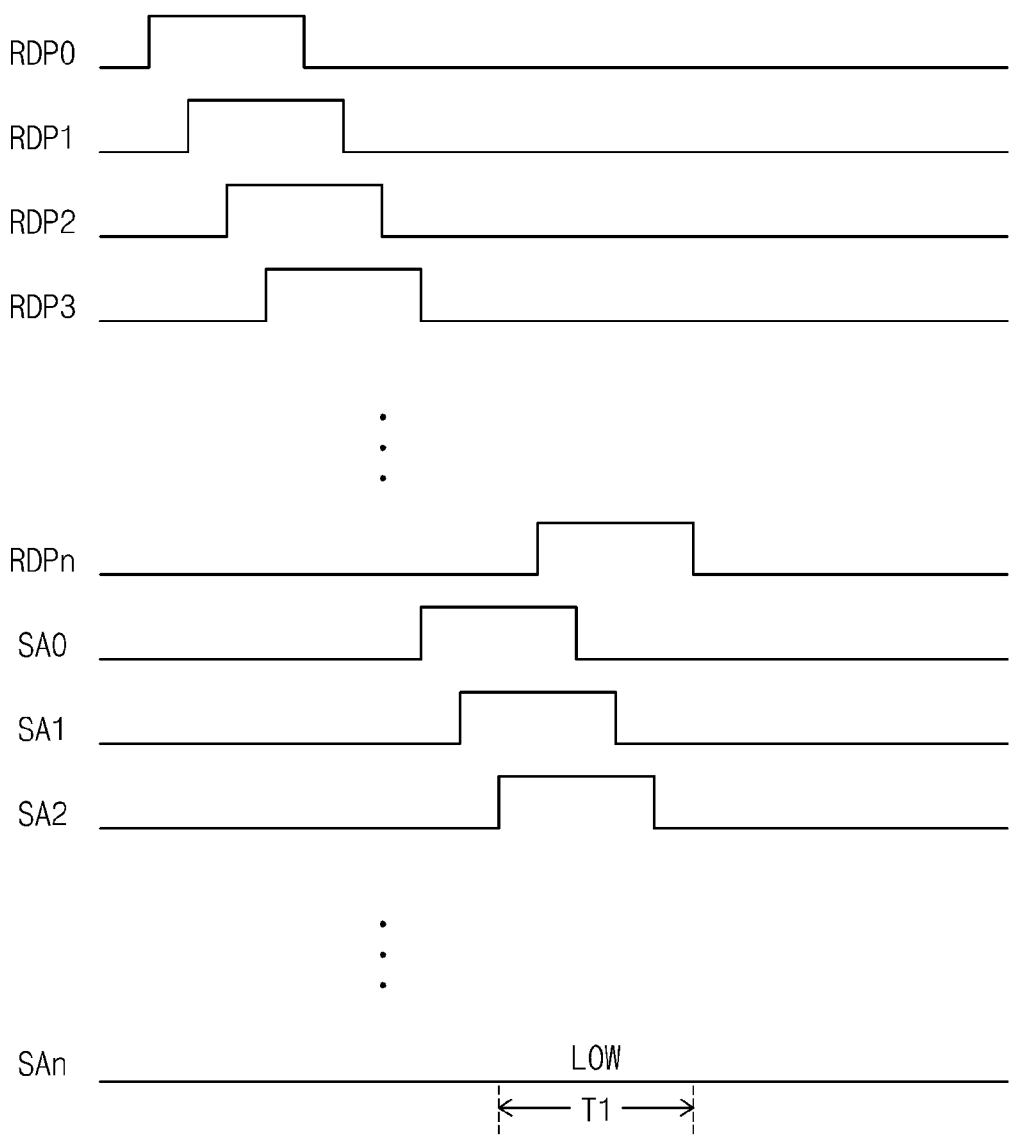
FIG. 16 is an operating timing diagram of a fuse program circuit of FIG. 14, according to an exemplary embodiment.

FIG. 16 is an operating timing diagram of a fuse program circuit of FIG. 14, according to an exemplary embodiment. In FIG. 16, waveforms RDP0 to RDPn may represent activation pulses. As the waveforms are sequentially shifted, fuse box lines 300-1 to 300-n may be sequentially activated.

Returning to FIG. 14, a fuse sensing unit 240 may sequentially sense fuse box lines 300-1 to 300-3 to detect whether anti-fuses are ruptured. A detailed operation of the fuse sensing unit 240 will be more fully described with reference to FIG. 2 later.

If a sensing result of the fuse sensing unit 240 indicates that the fuse box lines 300-1 to 300-3 are used at previous repair operations, fuse sensing signals SA0 to SA2 may have logic high levels. An output OUT of a decision circuit 250 may be output as a search fail signal on a line L30.

If a sensing result of the fuse sensing unit 240 indicates that the fuse box line 300-n is not used at a previous repair operation, a fuse sensing signal San may have a logic low level as illustrated in FIG. 16. An output OUT of a decision circuit 250 may be output as a search success signal on the line L30. Here, if the search success signal has a logic high level, the search fail signal may have a logic low level.

When the search success signal is output, a program controller 210 may provide a fuse row decoder 230 with a hold signal HOLD requesting an end of a scan operation through a line L20. At this time, the fuse row decoder 230 may hold a state where the fuse box line 300-n is activated. Meanwhile, the program controller 210 may inactivate a scan control signal SCS through a line L10. In this case, a switch SW10 of a fuse column decoder 220 may apply a rupture voltage RU-V for programming to a selected column of an anti-fuse array 300. Anti-fuses in the fuse box line 300-n may be ruptured according to a fail address stored at a fail address memory. As a result, anti-fuses not used at previous programming may be automatically searched for, and a fail address stored at the fail address memory may be programmed at the searched anti-fuses.

In the event that another fail address is stored in the fail address memory after the fuse box line 300-*n* is programmed, the above-described scan and program operations may be again performed.

Thus, in case that the number of fail addresses additionally generated is N (N being a natural number greater than or equal to 2), the scan and program operations may be performed at the same time. However, the inventive concept is not limited thereto. For example, a program operation may be manually performed by a user every fail address.

Figure 15:
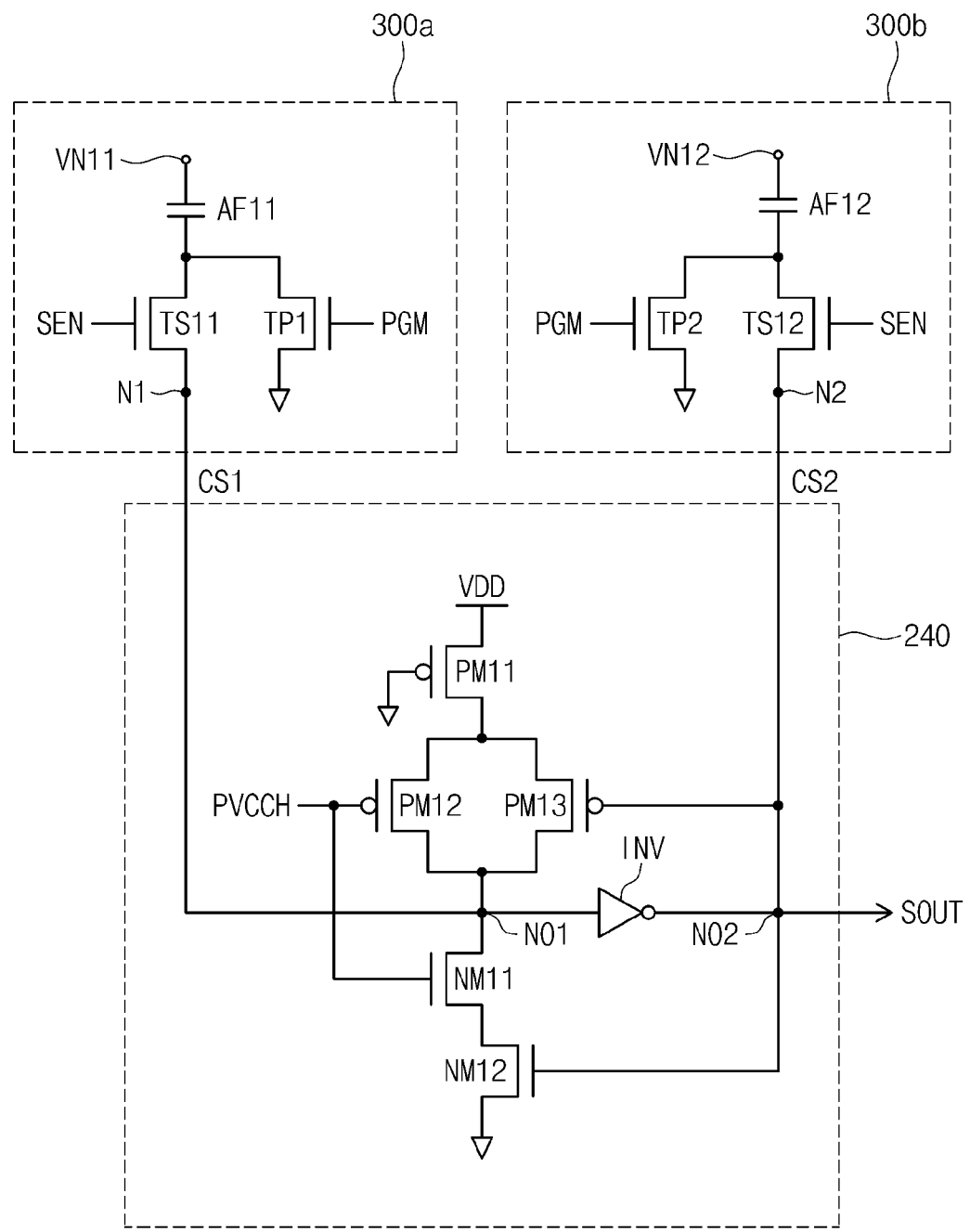
FIG. 15 is a circuit diagram for describing a fuse sensing operation of a fuse sensing unit of FIG. 14, according to an exemplary embodiment.

FIG. 15 is a circuit diagram for describing a fuse sensing operation of a fuse sensing unit of FIG. 14, according to an exemplary embodiment.

Referring to FIG. 15, there is illustrated an example where a fuse sensing unit 240 is connected to first and second program units 300*a* and 300*b* of an anti-fuse array 300.

In FIG. 15, there is illustrated an example where the first program unit 300*a* includes a first anti-fuse AF11 connected between a first voltage terminal VN11 and an output node N1 of a first signal CS1, and the second program unit 300*b* includes a second anti-fuse AF12 connected between a second voltage terminal VN12 and an output node N2 of a second signal CS2.

The first program unit 300*a* may be configured to include the first anti-fuse AF11, a first switching transistor TS11, and a first program transistor TP1. One end of the first anti-fuse AF11 may be connected to the first voltage terminal VN11, and the first switching transistor TS11 may be connected between the other end of the first anti-fuse AF11 and the output node N1. A sensing enable signal SEN may be applied to a gate of the first switching transistor TS11. The first program transistor TP1 may be connected between the other end of the first anti-fuse AF11 and a ground, and a program signal PGM may be applied to a gate of the first program transistor TP1.

The second program unit 300*b* may be configured to include the second anti-fuse AF12, a second switching transistor TS12, and a second program transistor TP2. One end of the second anti-fuse AF12 may be connected to the second voltage terminal VN12, and the second switching transistor TS12 may be connected between the other end of the second anti-fuse AF12 and the output node N2. The sensing enable signal SEN may be applied to a gate of the second switching transistor TS12. The second program transistor TP2 may be connected between the other end of the second anti-fuse AF12 and a ground, and the program signal PGM may be applied to a gate of the second program transistor TP2.

The fuse sensing unit 240 may include first to third p-type metal oxide semiconductor (PMOS) transistors PM11 to PM13, first and second n-type MOS (NMOS) transistors NM11 and NM12, and an inverter INV. Since the third PMOS transistor PM13 and the second NMOS transistor NM12 perform an inverter function, the fuse sensing unit 240 may have a latch structure where two inverters are interconnected. The second PMOS transistor PM12 and the first NMOS transistor NM11 may be used to set initial states of first and second latch nodes NO1 and NO2.

At a sensing operation, a voltage for pulling down the first latch node NO1 may be applied to the first voltage terminal VN11, and a voltage for pulling up the second latch node NO2 may be applied to the second voltage terminal VN12. For example, at the sensing operation, a ground voltage may be applied to the first voltage terminal VN11, and a power supply voltage VDD may be applied to the second voltage terminal VN12.

Since the second PMOS transistor PM12 is turned on and the first NMOS transistor NM11 is turned off before a power-up signal PVCCH is activated to a high level, the first latch node NO1 may be set to a logic high and the second latch node NO2 may be set to a logic low.

In the event that the first and second anti-fuses AF11 and AF12 are not programmed, the voltage terminals VN11 and VN12 may be electrically separated from the sensing nodes NO1 and NO2 although the switching transistors TS11 and TS12 are turned on by activation of the sensing enables signal SEN. Thus, the second latch node NO2 may be stably set to logic low, and a sensing output signal SOUT may maintain logic low.

In the event that the first and second anti-fuses AF11 and AF12 are programmed, the voltage terminals VN11 and VN12 may be electrically connected to the sensing nodes NO1 and NO2 when the switching transistors TS11 and TS12 are turned on by activation of the sensing enables signal SEN. Since a relatively low pull-down voltage is applied to the first voltage terminal VN11 and a relatively high pull-up voltage is applied to the second voltage terminal VN12, the first latch node NO1 may transition from a logic high to a logic low, and the second latch node NO2 may transition from a logic low to a logic high. Thus, the second latch node NO2 may be stably set to a logic high, and a sensing output signal SOUT may maintain a logic high.

As described above, since the sensing output signal SOUT of the fuse sensing unit 240 has a logic low when anti-fuses are not programmed and a logic high when anti-fuses are programmed, whether anti-fuses are programmed may be determined.

An anti-fuse circuit of the anti-fuse array 300 of FIG. 12 may be configured the same as illustrated in FIG. 2.

That is, as illustrated in FIG. 2, the anti-fuse circuit 10*i* may include an anti-fuse 9, a pull-up transistor NM1, a pull-down transistor NM2, a level detector 2, and a pull-down control circuit 7. Also, the anti-fuse circuit 10*i* may further include an inverter 8 to invert a voltage of a node N1.

In general, a laser fuse may be programmed by cutting a fuse made of a metal line using a laser. However, a predetermined interval may be required between fuses to prevent a fuse rom being damaged by a laser. To improve a degree of integration of laser fuses may be limited regardless of development of a memory fabricating technology such a MOS process, and programming of laser fuses may be impossible after a memory chip is packaged.

Meanwhile, electrical fuses (E-fuses) and anti-fuses may be programmed using an electrical signal. That is, since fuse activation or inactivation is made by an electrical signal, the E-fuses and anti-fuses may be programmed after packaging. Also, a fuse circuit may be scaled down according to development of a memory fabricating technology.

The E-fuse may be programmed by applying a high level of current to the E-fuse. The E-fuse may be ruptured after packaging by applying a control signal to the E-fuse from an external device. However, a large size of driver may be required to apply a much amount of current to the E-fuse.

Unlike the E-fuse, the anti-fuse may be programmed by applying a high voltage between both ends of the anti-fuse. In general, the anti-fuse may be formed of a capacitor element. If a high voltage is applied between both ends of the anti-fuse, a dielectric material in a capacitor may be broken, so that the anti-fuse acts as a conductor. Like the E-fuse, the anti-fuse may be ruptured after packaging by applying a control signal to the anti-fuse from an external device.

The inventive concept is described using an anti-fuse. However, E-fuses may be applicable to the inventive concept.

Figure 17:
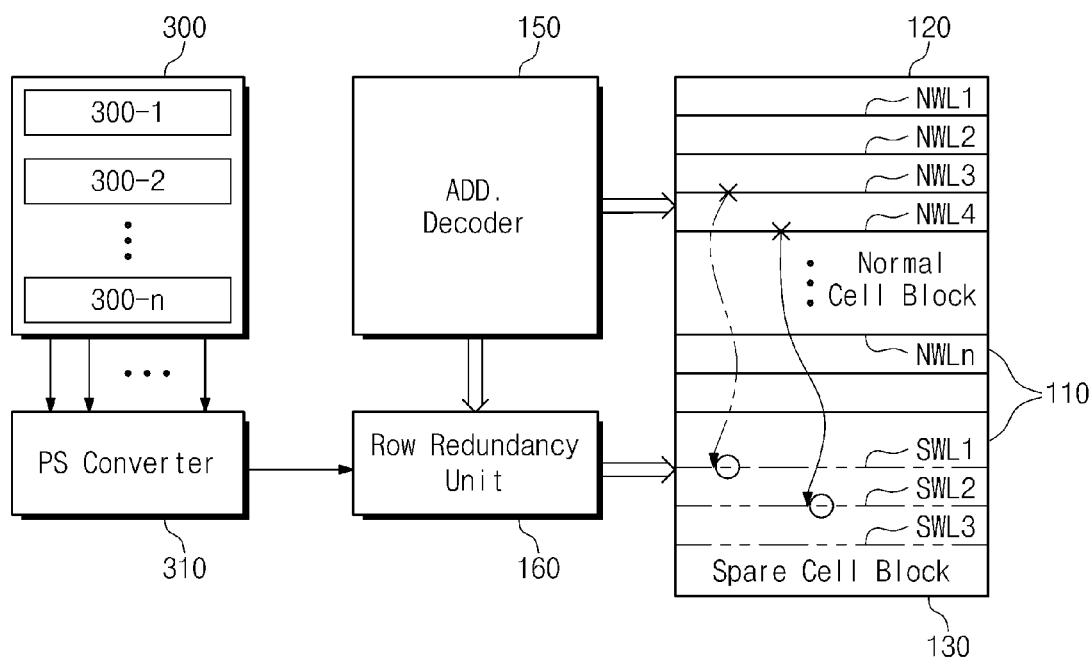
FIG. 17 is a circuit block diagram schematically illustrating a row repair operation of FIG. 12, according to an exemplary embodiment.

FIG. 17 is a circuit block diagram schematically illustrating a row repair operation of FIG. 12, according to an exemplary embodiment.

Referring to FIG. 17, a semiconductor memory device may include an anti-fuse array 300, a parallel-serial converter 310, an address decoder 150, a row redundancy unit 160, and a memory cell array 110.

The memory cell array 110 may include a normal cell block 120 having normal memory cells connected to normal word lines NWL1 to NWLn and a spare cell block 130 having redundancy memory cells connected to spare word lines SWL1 to SWL3.

The anti-fuse array 300 may have fuse box lines 300-1 to 300-n each including a plurality of anti-fuses. The fuse box lines 300-1 to 300-n correspond to the anti-fuse array units 11 through 15 shown in FIGS. 1 and 4.

The parallel-serial converter 310 may be configured to convert parallel fail data from the anti-fuse array 300 into serial data.

The address decoder 150 may decode an input address to generate a decoded normal address.

The row redundancy unit 160 may compare the decoded normal address and a fail address. The row redundancy unit 160 may activate a spare word line when the decoded normal address coincides with the fail address.

As shown in FIG. 17, a normal word line NWL3 of the normal cell block 120 may be defective. Then, a row address for selecting the normal word line NWL3 may be programmed as a fail address using a fuse box line 300-1 of the anti-fuse array 300. In this case, if a row address for selecting the normal word line NWL3 is received at a memory access operation, a spare word line SWL1 of the spare cell block 130 may be activated instead of the normal word line NWL3. As a result, a defective normal word line may be repaired by performing a repair operation.

As shown in FIG. 17, at least one of memory cells connected with a normal word line NWL4 may be determined to be defective at a shipping test level after the fuse box line 300-1 is programmed. In this case, there is required previous repair information, that is, information indicating programmed fuse box lines of fuse box lines 300-1 to 300-n of the anti-fuse array 300. However, fail addresses additionally generated may be programmed without previous repair information by searching for fuse box lines not used at a previous repair operation through an operation of a fuse programming circuit 200 as describe with reference to FIG. 14.

Thus, at additional programming, programming on the fuse box line 300-1 may be excluded, and another fail address additionally generated may be programmed at the fuse box line 300-2.

If a row address for selecting the normal word line NWL4 is received at a memory access operation, a spare word line SWL2 of the spare cell block 130 may be activated instead of the normal word line NWL4. As a result, a defective normal word line additionally detected may be repaired by performing an additional repair operation.

As a result, a test user need not refer to the previous repair information or history and generate a repair history database.

Figure 18:
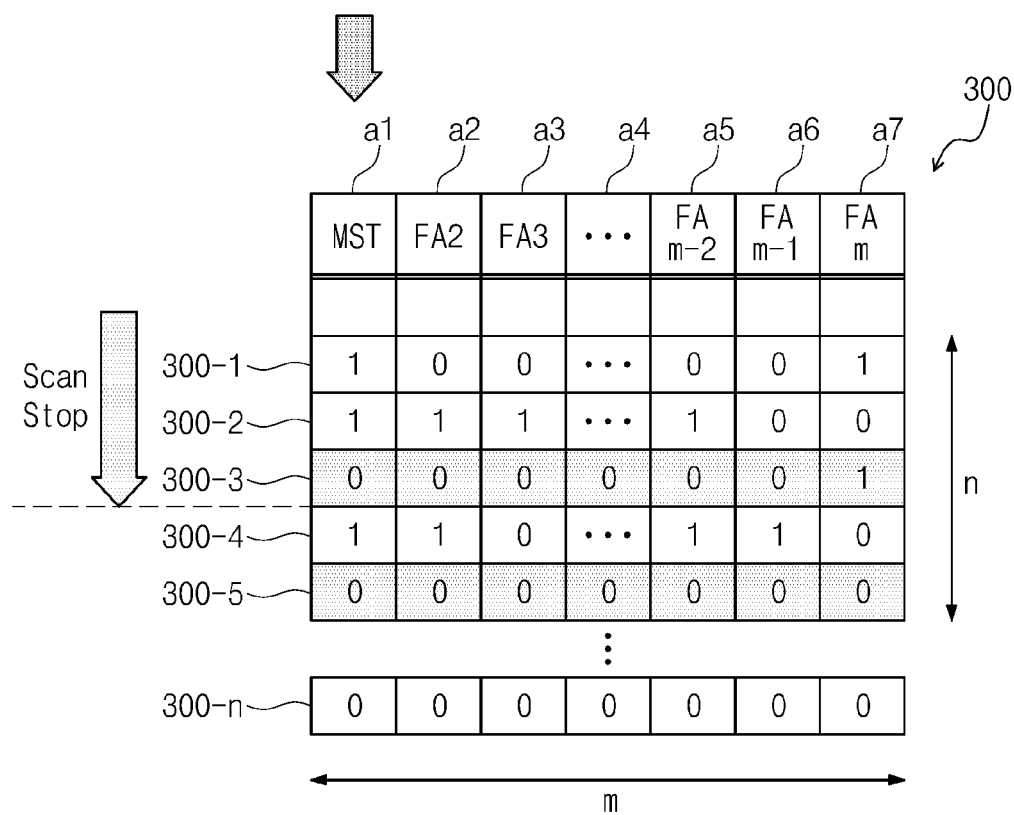
FIG. 18 is a diagram schematically illustrating an anti-fuse array of FIG. 14 which includes additional bits, according to an exemplary embodiment.

FIG. 18 is a diagram schematically illustrating the anti-fuse array 300 of FIG. 14 which includes additional bits, according to an exemplary embodiment.

Referring to FIG. 18, the anti-fuse array 300 may include fuse box lines 300-1 to 300-n (n being a natural number greater than or equal to 2). Each fuse box line (e.g., 300-1) may include m anti-fuses (m being a natural number greater than or equal to 3). A master bit a1 of the m anti-fuses may be used as an additional bit. The additional bit may be used as a flag bit indicating whether the fuse box line 300-1 is a valid resource. For example, if the master bit a1 is "0", a fuse box line may be regarded as a programmable resource. If the master bit a1 is "1", a fuse box line may be regarded as a previously programmed resource and excluded from a programmable resource. The number of the remaining bits (m−A: A being the number of additional bits) of m bits of the fuse box line 300-1 other than an additional bit may be equal to or greater than the number of fail address bits. For example, in the event that the number of fail address bits is 13, (m−A) bits of the fuse box line 300-1 may be at least 13 bits.

In FIG. 18, valid fuse box lines may be searched for by sequentially scanning master bits a1 (or, MSBs) of the fuse box lines 300-1 to 300-n. That is, when a fail address is additionally generated, valid fuse box lines of the anti-fuse array 300 may be searched for by sensing master bits a1 of the fuse box lines 300-1 to 300-n. As illustrated in FIG. 18, since a master bit a1 of a third fuse box line 300-3 is "0", the third fuse box line 300-3 may be first searched for as a valid resource. If a fail address is programmed at the third fuse box line 300-3, the master bit a1 of the third fuse box line 300-3 may be set to "1". If a search operation is resumed after a program operation, a fifth fuse box line 300-5 may be second searched for as a valid resource. The reason may be that a master bit a1 of a fifth fuse box line 300-5 is "0".

All bits in a fuse box line need not be sensed by setting an additional bit to a flag information bit, so that a fuse box line usable as a valid resource is easily searched.

Figure 19:
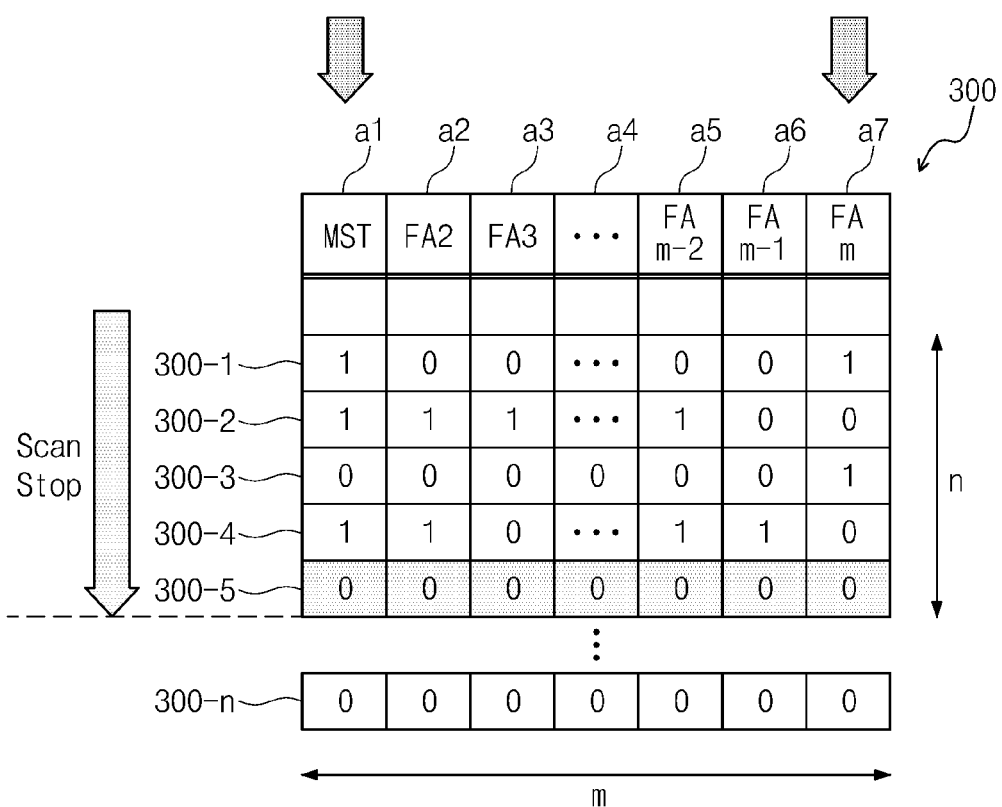
FIG. 19 is a diagram schematically illustrating an anti-fuse array of FIG. 14 which includes additional bits, according to an exemplary embodiment.

FIG. 19 is a diagram schematically illustrating the anti-fuse array 200 of FIG. 14 which includes additional bits, according to an exemplary embodiment.

Referring to FIG. 19, the anti-fuse array 300 may include fuse box lines 300-1 to 300-n (n being a natural number greater than or equal to 2) like FIG. 18. Each fuse box line (e.g., 300-5) may include m anti-fuses (m being a natural number greater than or equal to 3). A master bit a1 (i.e., MSB) and an m-th bit a7 (i.e., LSB) of the m anti-fuses may be used as additional bits. The additional bits may be used as a flag bit indicating whether the fuse box line 300-5 is a valid resource. For example, if the master bit a1 and the m-th bit a7 are "0", a fuse box line may be regarded as a programmable resource. If at least one of the master bit a1 and the m-th bit a7 is "1", a fuse box line may be regarded as a previously programmed resource and excluded from a programmable resource. The number of the remaining bits (m−A: A being the number of additional bits) of m bits of the fuse box line 300-5 other than two additional bits may be equal to or more than the number of fail address bits. For example, in the event that the number of fail address bits is 13, (m−A) bits of the fuse box line 300-5 may be at least 13 bits.

In FIG. 19, valid fuse box lines may be searched for by sequentially scanning master bits a1 (or, MSBs) and m-th bits a7 (or, LSBs) of the fuse box lines 300-1 to 300-n. That is, when a fail address is additionally generated, valid fuse box lines of the anti-fuse array 300 may be searched for by sensing master and m-th bits a1 and a7 of a fuse box line. As illustrated in FIG. 19, since the master bit a1 and the m-th bit a7 of a fifth fuse box line 300-5 is "0", the fifth fuse box line 300-5 may be searched for as a valid resource. If a fail address is programmed at the fifth fuse box line 300-5, at least one of the master bit a1 and the m-th bit a7 of the fifth fuse box line 300-5 may be set to "1". If a search operation is resumed after a program operation, a fuse box line whose master and m-th bits a1 and a7 are set to "0" may be searched.

With the above description, all bits in a fuse box line need not be sensed by setting two additional bits to flag information bits, so that a fuse box line usable as a valid resource is easily searched.

An example where a bit is used as an additional bit for scanning a valid resource is described with reference to FIG. 18, and another example where two bits are used as additional bits for scanning a valid resource is described with reference to FIG. 19. However, the inventive concept is not limited thereto. For example, three or more additional bits can be used as flag information bits to improve reliability.

Figure 20:
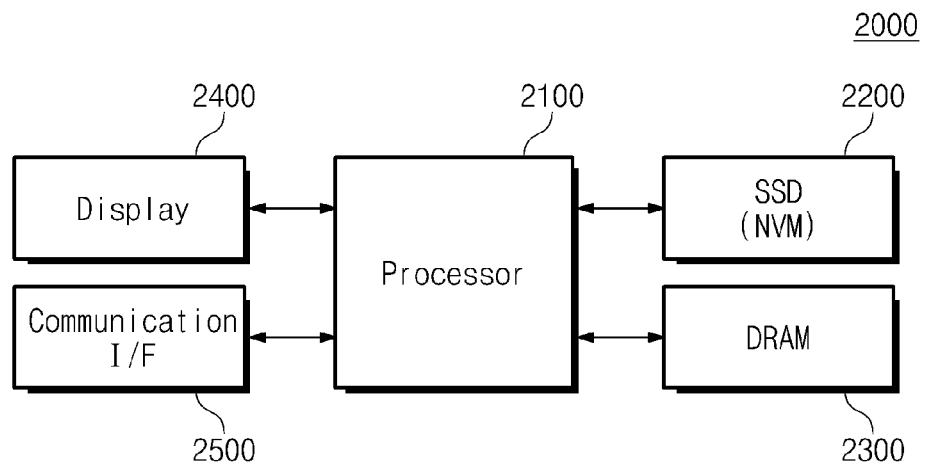
FIG. 20 is a block diagram schematically illustrating a mobile device including a semiconductor memory device according to an exemplary embodiment.

FIG. 20 is a block diagram schematically illustrating a mobile device including a semiconductor memory device according to an exemplary embodiment.

Referring to FIG. 20, a mobile device 2000 may include a processor 2100, a solid state drive (SSD) 2200, a DRAM 2300, a display 2400, and a communication interface 2500.

In some cases, the processor 2100, the DRAM 2300, and the SSD 2200 may be provided in the form of a package or integrated to a chip. This may mean that the DRAM 2300 and the SSD 2200 are embedded in the mobile device.

If the mobile device 2000 is a portable communications device, the communication interface 2500 may be connected with a modem and transceiver block which is configured to perform a communication data transmitting and receiving function and a data modulating and demodulating function.

The processor 2100 may control an overall operation of the mobile device 2000.

The DRAM 2300 may be connected to the processor 2100 through a system bus, and may be used as a buffer memory or a main memory of the processor 2100.

The SSD 2200 may include a NOR or NAND flash memory.

The display 2400 may have a liquid crystal having a backlight, a liquid crystal having an LED light source, or a touch screen (e.g., OLED). The display 2400 may operate as an image output device for displaying images (e.g., characters, numbers, pictures, etc.) in color.

The inventive concept may be described under assumption that the mobile device 2000 is a mobile communications device. In some cases, the mobile device 2000 may function as a smart card by adding or removing components to or from the mobile device 2000.

In FIG. 20, there is illustrated an example in which the SSD 2200 is used. However, a variety of semiconductor storage devices may be used instead of the SSD 2200. In this case, the semiconductor storage devices may store data information having various data formats such as a text, a graphic, a software code, and so on.

According to exemplary embodiments, the DRAM 2300 may have the same structure as that of a semiconductor memory device 100 of FIG. 7. The DRAM 2300 may calculate a usable bit number before performing a post package repair operation. The DRAM 2300 may compare the usable bit number and a defective bit number and decide whether to perform a post package repair operation according to a comparison result.

Prior to a post package repair operation on defective cells of the DRAM 2300 additionally generated, the mobile device 2000 may in advance determine whether it is possible to complete a post package repair operation successfully, based on the usable bit number. In the event that it is impossible to complete a post package repair operation successfully, the mobile device 2000 may manage a post package repair command not to be executable without execution of the post package repair operation. In this case, it is possible to prevent time and resource loss caused by a post package repair operation performed when it is impossible to complete a post package repair successfully.

Figure 21:
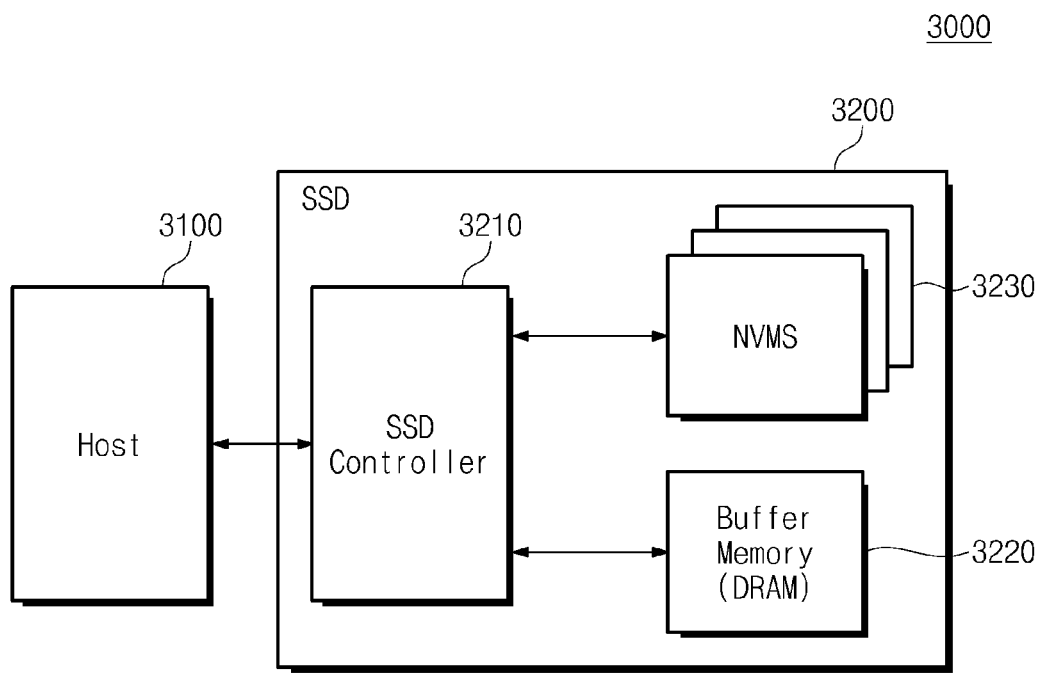
FIG. 21 is a block diagram illustrating a solid state drive including a semiconductor memory device according to an exemplary embodiment.

FIG. 21 is a block diagram illustrating a solid state drive including a semiconductor memory device according to an exemplary embodiment of the inventive concept. Referring to FIG. 21, a user device 3000 may include a host 3100 and a solid state drive (hereinafter, referred to as SSD) 3200. The SSD 3200 may include an SSD controller 3210, a buffer memory 3220, and a semiconductor memory device 3230.

The SSD controller 3210 may provide physical interconnection between the host 3100 and the SSD 3200. The SSD controller 3210 may provide an interface with the SSD 3200 corresponding to a bus format of the host 3100. In particular, the SSD controller 3210 may decode a command provided from the host 3100 to access the semiconductor memory device 3230 based on the decoding result.

The buffer memory 3220 may temporarily store write data provided from the host 3100 or data read out from the semiconductor memory device 3230. In the event that data existing in the semiconductor memory device 3230 is cached, at a read request of the host 3100, the buffer memory 3220 may support a cache function to provide cached data directly to the host 3100. Typically, a data transfer speed of a bus format (e.g., SATA or SAS) of the host 3100 may be greater than that of a memory channel of the SSD 3200. That is, in the event that an interface speed of the host 3100 is remarkably fast, lowering of the performance due to a speed difference may be minimized by providing the buffer memory 3220 having a large storage capacity.

The buffer memory 3220 may be formed of a synchronous DRAM to provide sufficient buffering to the SSD 3200 used as an auxiliary mass storage device.

The semiconductor memory device 3230 may be provided as a storage medium of the SSD 3200. For example, the semiconductor memory device 3230 may be formed of a magnetic random access memory (MRAM) having a mass storage capacity. The semiconductor memory device 3230 may be formed of a plurality of memory devices. In this case, the memory devices may be connected to the SSD controller 3210 by a channel unit, respectively. As storage medium, the semiconductor memory device 3230 may be formed of an MRAM. However, the semiconductor memory device 3230 is not limited to the MRAM. For example, a storage medium of the SSD 3200 can be formed of a PRAM, an MRAM, a ReRAM, a FRAM, a NOR flash memory, and the like. Further, the inventive concept may be applied to a memory system which uses different types of memory devices together.

In the SSD 3200, the buffer memory 3220 may have the same structure as that of a semiconductor memory device 100 of FIG. 7. If a defective cell is generated, the buffer memory 3220 may calculate a usable bit number before performing a post package repair operation on the defective cell. The buffer memory 3220 may compare the usable bit number and a defective bit number and decide whether to perform a post package repair operation according to a comparison result. A post package repair method of the buffer memory 3220 may be the same as that of the semiconductor memory device 100 of FIG. 7.

Prior to a post package repair operation on defective cells of the buffer memory 3220 additionally generated, the SSD 3200 may in advance determine whether it is possible to complete a post package repair operation successfully, based on the usable bit number. In the event that it is impossible to complete a post package repair operation successfully, the SSD 3200 may manage a post package repair command not to be executable without execution of the post package repair operation. In this case, it is possible to prevent time and resource loss caused by a post package repair operation performed when it is impossible to complete a post package repair successfully.

Figure 22:
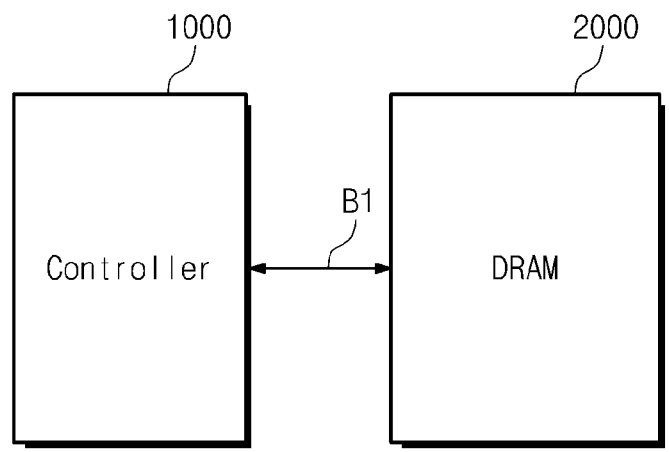
FIG. 22 is a block diagram schematically illustrating a memory system according to an exemplary embodiment.

FIG. 22 is a block diagram schematically illustrating a memory system according to an exemplary embodiment of the inventive concept.

Referring to FIG. 22, a memory system may include a controller 1000 and a DRAM 2000.

The DRAM 2000 may have the same structure as that of a semiconductor memory device 100 of FIG. 7. If a post package repair command is received, the DRAM 2000 may repair a defective cell in response to the post package repair command. At this time, prior to repairing the defective cell, the DRAM 2000 may compare a usable bit number and a defective bit number. When the usable bit number is more than the defective bit number, the DRAM 2000 may perform a post package repair operation. If the usable bit number is greater than the defective bit number, the DRAM 2000 may provide the controller 1000 with a fail message indicating that the post package repair command is not executable.

A post package repair method of the DRAM 2000 may be the same as that of the semiconductor memory device 100 of FIG. 7.

The controller 1000 may be connected to a host (not shown) and the DRAM 2000. In response to a request from the host, the controller 1000 may access the DRAM 2000. For example, the controller 1000 may be configured to control an access operation of the DRAM 2000. The controller 1000 may be configured to provide an interface between the DRAM 2000 and the host. The controller 1000 may be configured to drive firmware for controlling the DRAM 2000.

The controller 1000 may be configured to provide a post package repair command, an input address or a control signal to the DRAM 2000. The DRAM 2000 may be configured to perform a read, a write, or a post package repair operation in response to a post package repair command, an input address or a control signal from the controller 2000.

According to exemplary embodiments, the controller 1000 may further comprise components such as a processing unit, a host interface, a memory interface, and so on. The processing unit may control an overall operation of the controller 1000.

The host interface may include the protocol for data exchange between the host and the controller 1000. For example, the controller 1000 may be configured to communicate with an external device (e.g., host) through at least one of various protocols such as an USB (Universal Serial Bus) protocol, an MMC (multimedia card) protocol, a PCI (peripheral component interconnection) protocol, a PCI-E (PCI-express) protocol, an ATA (Advanced Technology Attachment) protocol, a Serial-ATA protocol, a Parallel-ATA protocol, a SCSI (small computer small interface) protocol, an ESDI (enhanced small disk interface) protocol, an IDE (Integrated Drive Electronics) protocol, and so on.

According to exemplary embodiments, the memory system may be used as computer, portable computer, Ultra Mobile PC (UMPC), workstation, net-book, PDA, web tablet, wireless phone, mobile phone, smart phone, e-book, PMP (portable multimedia player), portable game machine, digital camera, digital audio recorder/player, digital picture/video recorder/player, portable game machine, navigation system, black box, 3-dimensional television, a device capable of transmitting and receiving information at a wireless circumstance, one of various electronic devices constituting home network, one of various electronic devices constituting computer network, one of various electronic devices constituting telematics network, RFID, or one of various electronic devices constituting a computing system.

Prior to execution of a post package repair operation, the memory system may in advance determine whether it is possible to complete a post package repair operation successfully, based on a usable bit number. In the event that it is impossible to complete a post package repair operation successfully, the memory system may manage a post package repair command not to be executable without execution of the post package repair operation. In this case, it is possible to prevent time and resource loss caused by a post package repair operation performed when it is impossible to complete a post package repair successfully.

The DRAM 2000 may include a circuit structure of FIG. 1 or 4.

Thus, since simultaneous activation of spare word lines of the DRAM 2000 is prevented at an access to the DRAM 2000, only a spare word line may be activated. In this case, the reliability on a read or write operation may be improved. Also, since a cheaper memory is used through a repair scheme, a cost for implementation of a memory system may be reduced.

Figure 23:
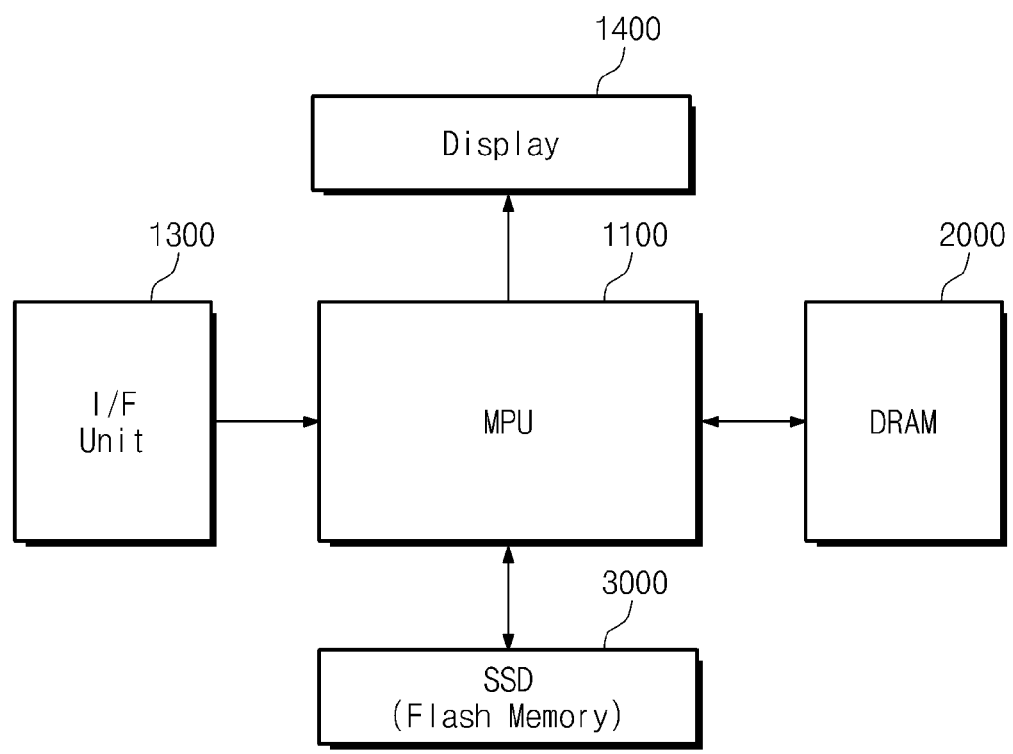
FIG. 23 is a block diagram schematically illustrating application of the inventive concept applied to a mobile device.

FIG. 23 is a block diagram schematically illustrating application of the inventive concept applied to a mobile device, according to an exemplary embodiment.

Referring to FIG. 23, a mobile device may be a notebook or a handheld electronic device, and may include a micro processing unit (MPU) 1100, an interface unit 1300, a display 1400, a DRAM 2000, and a solid state drive 3000.

In some cases, the MPU 1100, the DRAM 2000, and the SSD 3000 may be provided in the form of a package or integrated to a chip. This may mean that the DRAM 2000 and the SSD 3000 are embedded in the mobile device.

If the mobile device is a portable communications device, the interface unit 1300 may be connected with a modem and transceiver block which is configured to perform a communication data transmitting and receiving function and a data modulating and demodulating function.

The MPU 1100 may control an overall operation of the mobile device according to a given program.

The DRAM 2000 may be connected to the MPU 1100 through a system bus, and may be used as a buffer memory or a main memory of the MPU 1100.

Since simultaneous activation of spare word lines of the DRAM 2000 is prevented at an access to the DRAM 2000, only a spare word line may be activated. In this case, the reliability and performance on the mobile device may be improved. Also, since a cheaper memory is used through a repair scheme, a cost for manufacturing the mobile device may be reduced.

The solid state drive 3000 may include a NOR or NAND flash memory.

The display 1400 may have a liquid crystal having a backlight, a liquid crystal having an LED light source, or a touch screen (e.g., OLED). The display 1400 may be used as an output device for displaying images (e.g., characters, numbers, pictures, etc.) in color.

The inventive concept may be described under assumption that the mobile device is a mobile communications device. In some cases, the mobile device may function as a smart card by adding or removing components to or from the mobile device.

In case of the mobile device, a separate interface may be connected with an external communications device. The communications device may be a DVD player, a computer, a set top box (STB), a game machine, a digital camcorder, or the like.

Although not shown in FIG. 23, the mobile device may further include an application chipset, a camera image processor (CIS), a mobile DRAM, and so on.

A DRAM (2000) chip and a flash memory (3000) chip may be packed independently or using various packages. For example, a chip may be packed by a package such as PoP (Package on Package), Ball grid arrays (BGAs), Chip scale packages (CSPs), Plastic Leaded Chip Carrier (PLCC), Plastic Dual In-Line Package (PDIP), Die in Waffle Pack, Die in Wafer Form, Chip On Board (COB), Ceramic Dual In-Line Package (CERDIP), Plastic Metric Quad Flat Pack (MQFP), Thin Quad Flatpack (TQFP), Small Outline (SOIC), Shrink Small Outline Package (SSOP), Thin Small Outline (TSOP), System In Package (SIP), Multi Chip Package (MCP), Wafer-level Fabricated Package (WFP), Wafer-Level Processed Stack Package (WSP), or the like.

In FIG. 23, there is illustrated an example in which a flash memory is used. However, a variety of nonvolatile storages may be used. The nonvolatile storage may store data information having various data formats such as a text, a graphic, a software code, and so on.

Figure 24:
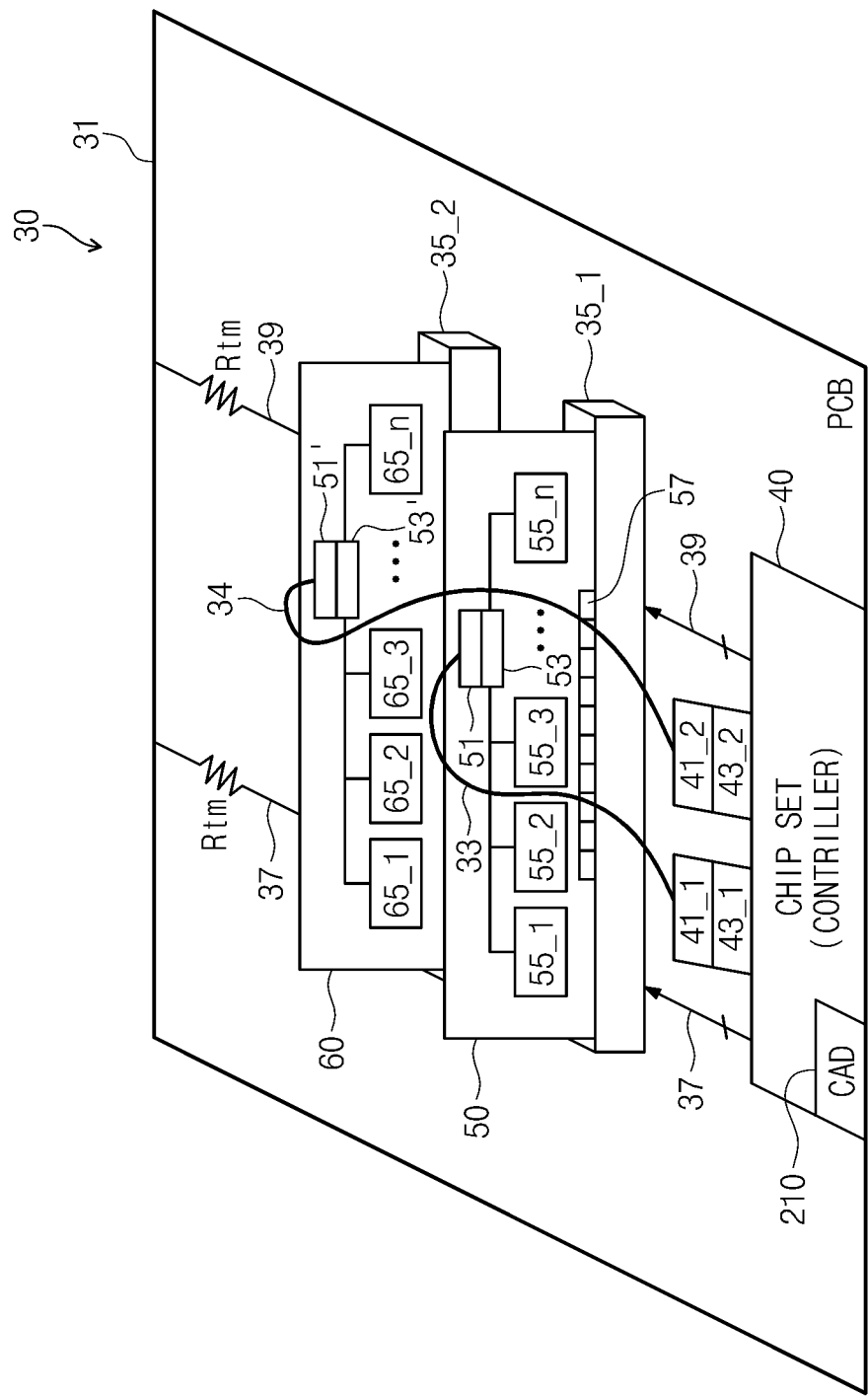
FIG. 24 is a block diagram schematically illustrating an application of the inventive concept applied to an optical I/O scheme.

FIG. 24 is a block diagram schematically illustrating an application of the inventive concept applied to an optical I/O scheme, according to an exemplary embodiment.

Referring to FIG. 24, a memory system 30 adopting a high-speed optical input/output scheme may include a chipset 40 as a controller and memory modules 50 and 60 mounted on a PCB substrate 31. The memory modules 50 and 60 may be inserted in slots 35_1 and 35_2 installed on the PCB substrate 31. The memory module 50 may include a connector 57, DRAM memory chips 55_1 to 55_n, an optical I/O input unit 51, and an optical I/O output unit 53.

The optical I/O input unit 51 may include a photoelectric conversion element (e.g., a photodiode) to convert an input optical signal into an electrical signal. The electrical signal output from the photoelectric conversion element may be received by the memory module 50. The optical I/O output unit 53 may include an electro-photic conversion element (e.g., a laser diode) to convert an electrical signal output from the memory module 50 into an optical signal. In some cases, the optical I/O output unit 53 may further include an optical modulator to modulate a signal output from a light source.

An optical cable 33 may perform a role of optical communications between the optical I/O input unit 51 of the memory module 50 and an optical transmission unit 41_1 of the chipset 200. The optical communications may have a bandwidth (e.g., more than score gigabits per second). The memory module 50 may receive signals or data from signal lines 37 and 39 of the chipset 200 through the connector 57, and may perform high-speed data communications with the chipset 200 through the optical cable 33. Meanwhile, resistors Rtm installed at lines 37 and 39 may be termination resistors.

The DRAM memory chips 55-1 to 55-n according to an exemplary embodiment of the inventive concept may be applied to the memory system 30 with the optical I/O structure of FIG. 24.

Thus, the reliability and performance of the memory system 30 may be improved.

In FIG. 24 the chipset 40 may include a concentration access detecting unit 210. The concentration access detecting unit 210 may generate a concentration access detection signal when an input frequency of a frequently applied address exceeds a threshold value.

When the concentration access detection signal is generated, the chipset 40 may prevent or alleviate corruption of data of memory cells adjacent to a specific memory area.

For example, if a specific word line, bit line or memory block of a volatile semiconductor memory (e.g., DRAM) is intensively accessed, corruption of cell data may be caused. That is, cell data of memory cells of word lines adjacent to a specific word line, bit lines adjacent to a specific bit line, or a memory block adjacent to a specific memory block may be lost due to a concentration access. It is necessary to prevent or alleviate a loss of cell data by solving or avoid address concentration.

In the case that the DRAM memory chips 55-1 to 55-n of the memory modules 50 and 60 are accessed by a memory page unit, a column unit or a bank unit, the concentration access detecting unit 210 may monitor access concentration.

In the case that the memory system 30 of FIG. 24 is an SSD, the DRAM memory chips 55_1 to 55_n may be used as a user data buffer.

Figure 25:
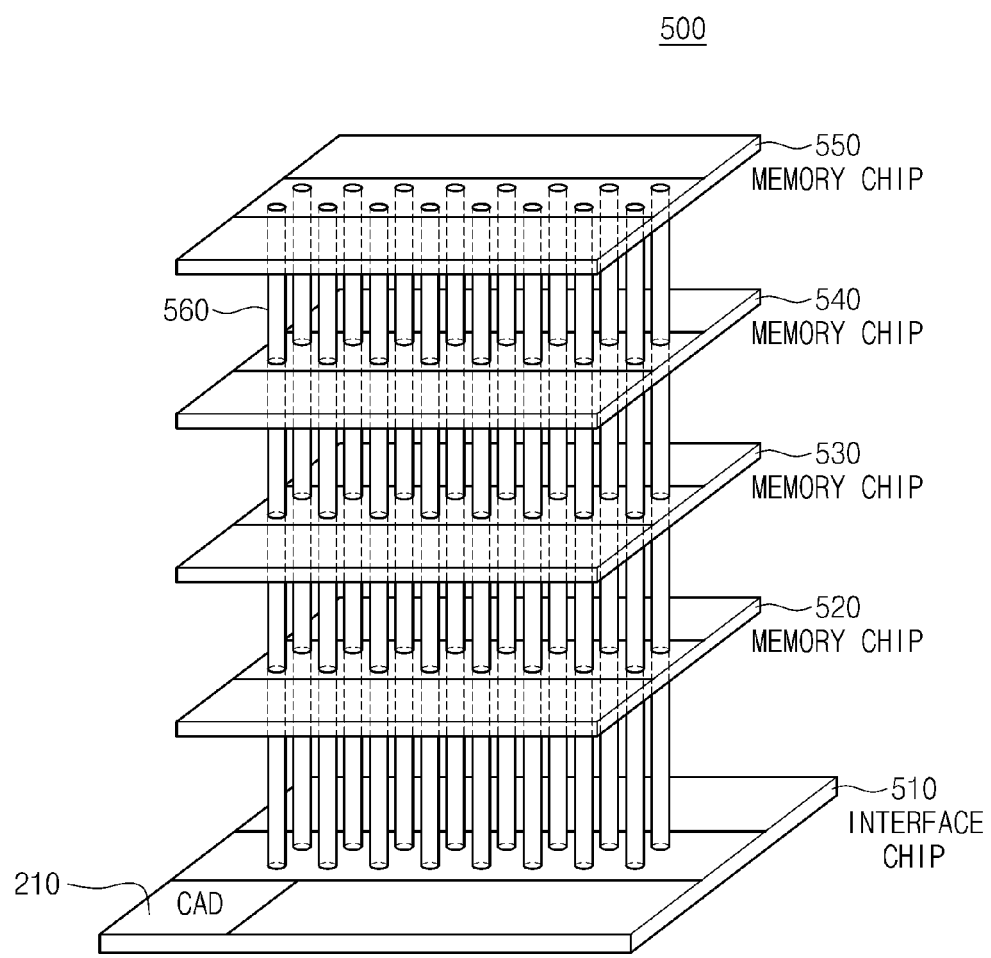
FIG. 25 is a diagram schematically illustrating an application of the inventive concept to which through-silicon via (TSV) is applied.

FIG. 25 is a diagram schematically illustrating an application of the inventive concept to which through-silicon via (TSV) is applied.

Referring to a stack type memory device 500 in FIG. 25, a plurality of memory chips 520, 530, 540, and 550 may be stacked on an interface chip 510 in a vertical direction. Herein, a plurality of through-silicon vias 560 may be formed to penetrate the memory chips 520, 530, 540, and 550. Mass data may be stored at the three-dimensional stack package type memory device 500 including the memory chips 520, 530, 540, and 550 stacked on the interface chip 510 in a vertical direction. Also, the three-dimensional stack package type memory device 500 may be advantageous for high speed, low power and scale-down.

The interface chip 510 may include a concentration access detecting unit 210, so that corruption of DRAM data in the memory chips 520, 530, 540, and 550 is prevented or alleviated.

In the stack type memory device of FIG. 25, DRAMs according to the inventive concept may be mounted. Thus, the reliability and performance of the stack type memory device may be improved.

A manner of preventing spare word lines from being activated at the same time may be variously changed and modified without departing from the spirit and scope of the present invention.

Returning to FIG. 22, a DRAM 2000 may be connected to a controller 1000 through a system bus B1, and may receive data, addresses and commands. Also, the DRAM 2000 may provide data read from memory cells to the controller 1000 through the system bus B1.

The DRAM 2000 may have a circuit structure illustrated in FIG. 12.

In the memory system, the DRAM 2000 may search for unused valid anti-fuses in an anti-fuse array to program a fail address additionally generated without previous repair information. Thus, test time and steps for a repair operation of defective memory cells may be reduced. This may mean that a cost for implementation of the memory system including the DRAM 2000 is lowered.

Returning to FIG. 23, a DRAM 2000 may be connected to an MPU 1100, and may be used as a buffer memory or a main memory of the MPU 1100. The DRAM 2000 may search for unused valid anti-fuses in an anti-fuse array to program a fail address additionally generated without previous repair information. Thus, since database on previous repair information need not be generated, test time and steps for a repair operation of defective memory cells may be reduced. This may mean that a cost for implementation of a mobile device including the DRAM 2000 is lowered.

A SSD 3000 may include a NOR or NAND flash memory.

The display 1400 may have a liquid crystal having a backlight, a liquid crystal having an LED light source, or a touch screen (e.g., OLED). The display 1400 may function as an output device for displaying images (e.g., characters, numbers, pictures, etc.) in color.

The inventive concept may be described under assumption that the mobile device is a mobile communications device. In some cases, the mobile device may function as a smart card by adding or removing components to or from the mobile device.

In case of the mobile device, a separate interface may be connected with an external communications device. The communications device may be a DVD player, a computer, a set top box (STB), a game machine, a digital camcorder, or the like.

Although not shown in FIG. 23, the mobile device may further include an application chipset, a camera image processor (CIS), a mobile DRAM, and so on.

In FIG. 23, there is illustrated an example in which a flash memory is used. However, a variety of nonvolatile storages may be used.

The nonvolatile storage may store data information having various data formats such as a text, a graphic, a software code, and so on.

The nonvolatile storage may be formed of EEPROM (Electrically Erasable Programmable Read-Only Memory), flash memory, MRAM (Magnetic RAM), STT-MRAM (Spin-Transfer Torque MRAM), CBRAM (Conductive bridging RAM), FeRAM (Ferroelectric RAM), PRAM (Phase change RAM) called OUM (Ovonic Unified Memory), RRAM or ReRAM (Resistive RAM), nanotube RRAM, PoRAM (Polymer RAM), NFGM (Nano Floating Gate Memory), holographic memory, molecular electronics memory device), or insulator resistance change memory.

Returning to FIG. 24, the DRAM memory chips 55_1 to 55_n according to the inventive concept may be mounted at the memory system 30 adopting an optical I/O structure. In the memory system 30, when a fail address is additionally generated, the DRAM memory chips 55_1 to 55_n may search for unused valid anti-fuses in an anti-fuse array to program a fail address additionally generated without previous repair information. Thus, since database on previous repair information need not be generated or secured, test time and steps for a repair operation of defective memory cells may be reduced.

Returning to FIG. 25, DRAMs according to the inventive concept may be applied to a stack type memory device. In the event that a fail address is additionally programmed, a DRAM constituting memory chips 520 to 550 may automatically search for unused valid anti-fuse array units in an anti-fuse array not participating in previous programming to program a fail address additionally generated at the searched anti-fuse array units without previous repair information. Thus, since a database on previous repair information need not be generated, test time and steps for a repair operation of defective memory cells may be reduced.

Figure 26:
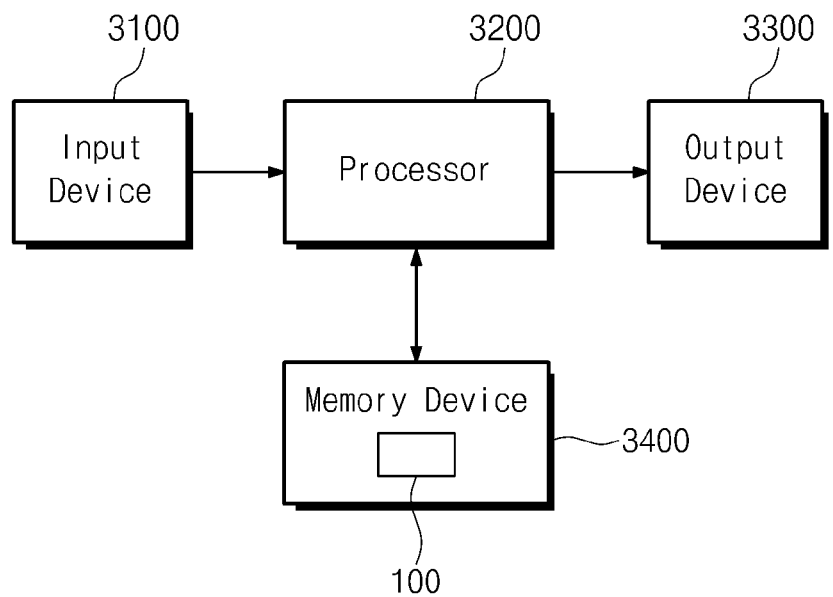
FIG. 26 is a block diagram schematically illustrating an application of the inventive concept applied to an electronic system.

FIG. 26 is a block diagram schematically illustrating an application of the inventive concept applied to an electronic system. As illustrated in FIG. 26, an electronic system may include an input device 3100, an output device 3300, a processor 3200, and a memory device 3400. The memory device 3400 may include a DRAM 100 of FIG. 1. Also, note that the DRAM 100 is integrated in one of the input device 3100, the output device 3300, and the processor 3200.

The DRAM 100 of FIG. 26 may include a fuse programming circuit. In the event that a fail address is additionally generated after programming of a fail address, the DRAM 100 may search unused valid anti-fuse array units in an anti-fuse array to program a fail address additionally generated without previous repair information. Thus, previous repair information and new repair information need not be generated.

Figure 27:
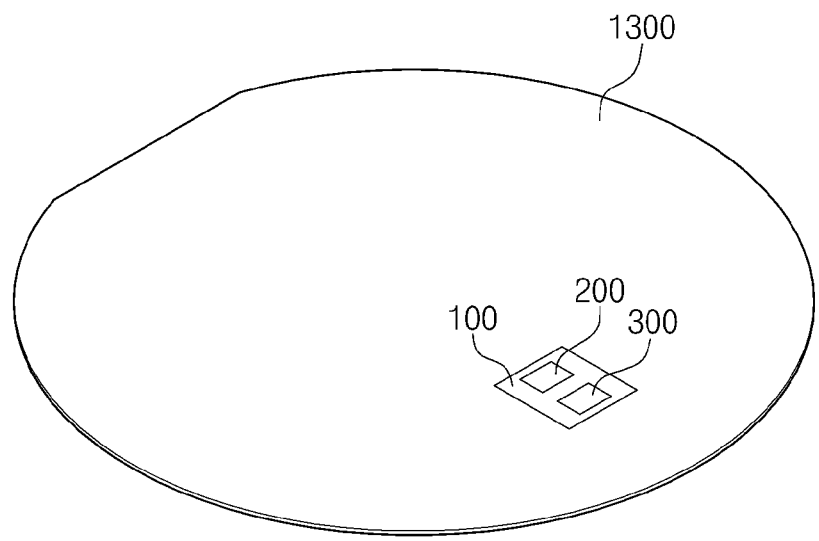
FIG. 27 is a diagram schematically illustrating a semiconductor wafer according to an exemplary embodiment.

FIG. 27 is a diagram schematically illustrating a semiconductor wafer according to an exemplary embodiment of the inventive concept.

Referring to FIG. 27, a memory device 100 such as DRAM may be fabricated on a semiconductor wafer 1300. It is well understood that the memory device 100 is fabricated on a variety of semiconductor substrates. The memory device 100 may include a fuse programming circuit 200 and an anti-fuse array 300.

Thus, in the event that a fail address is additionally generated after programming of a fail address, it is possible to search for unused valid anti-fuse array units in an anti-fuse array and to program a fail address additionally generated, without previous repair information. Thus, previous repair information need not be secured.

For example, various modifications and changes on disclosed circuits may be made without departing from the spirit and scope of the inventive concept. This may make it possible to search unused valid anti-fuses in an anti-fuse array and to program a fail address additionally generated at the searched valid anti-fuses. Also, the inventive concept is described using a DRAM including DRAM memory cells. However, the inventive concept is not limited thereto. For example, the inventive concept may be applied to all semiconductor memory devices necessitating fuse programming.

While the inventive concept has been described with reference to exemplary embodiments, it will be apparent to those skilled in the art that various changes and modifications may be made without departing from the spirit and scope of the present invention. Therefore, it should be understood that the above embodiments are not limiting, but illustrative.

What is claimed is:

1. A method of managing spare lines, comprising:
    programming a fail address of a word line determined to be defective;
    reprogramming the fail address if a first spare line for the word line is determined to be defective;
    storing additional information with respect to the reprogrammed fail address; and
    activating a second spare line and inactivating the first spare line, referring to the additional information
    wherein the storing comprises programming an additional bit for the programmed fail address,
    wherein the second spare line is activated referring to the additional bit, and
    wherein the additional bit is programmed based on history information about a previous repair of a memory cell connected to the word line.

2. The method of claim 1, wherein the first or second spare line is a spare word line among the spare word line and a spare bit line.

3. The method of claim 1, further comprising generating a priority signal and a blocking signal,
    wherein the second spare line is activated by the priority signal and all other spare lines including the first spare line are inactivated by the blocking signal.

4. The method of claim 1, wherein if the second spare line is determined to be defective, information indicating a further repair of the memory cell is impossible is output.

5. The method of claim 1, wherein the fail address is programmed and reprogrammed using an anti-fuse array unit of an anti-fuse circuit comprising a plurality of anti-fuse array units, the anti-fuse array unit including at least one anti-fuse.

6. The method of claim 1, wherein the additional information is stored regardless of history information about a previous repair of a memory cell connected to the word line.

7. The method of claim 1, wherein the additional information is indicated at an anti-fuse array unit of an anti-fuse circuit comprising a plurality of anti-fuse array units, the anti-fuse array unit including at least one anti-fuse and being used for the reprogramming the fail address.

8. The method of claim 1, wherein a memory cell connected with the spare line is a dynamic random access memory (DRAM) cell.

9. The method of claim 1, wherein the additional information is stored in a form of at least one or more bits.

10. The method of claim 1, wherein the additional information is indicated at an anti-fuse array unit of an anti-fuse circuit comprising a plurality of anti-fuse array units, the anti-fuse array unit including at least one anti-fuse and being used for the programming the fail address.

11. The method of claim 1, wherein the additional bit is programmed by rupturing an anti-fuse of an anti-fuse array comprising a plurality of anti-fuse arrays, the anti-fuse array being used for the programming the fail address.

12. The method of claim 1, wherein a memory cell connected with the first or second spare line is a volatile memory cell.

13. The method of claim 1, further comprising programming an additional bit for the reprogrammed fail address if the second spare line is determined to be defective.

14. A semiconductor memory device, comprising:
a circuitry configured to program a fail address of a word line determined to be defective, reprogram the fail address if a first spare line for the word line is determined to be defective, and store additional information with respect to the reprogrammed fail address;
a memory cell array including a normal memory cell block, including the word line, and a spare cell block including the first spare line; and
a control circuit configured to activate a second spare line in the spare cell block and inactivate the first spare line, referring to the additional information,
wherein the circuitry programs an additional bit for the programmed fail address,
wherein the second spare line is activated referring to the additional bit, and
wherein the additional bit is programmed based on history information about a previous repair of a memory cell connected to the word line.

* * * * *